(12) United States Patent
Lo et al.

(10) Patent No.: US 8,567,992 B2
(45) Date of Patent: Oct. 29, 2013

(54) INTEGRALLY FORMED LIGHT EMITTING DIODE LIGHT WIRE AND USES THEREOF

(75) Inventors: Paul Lo, Kowloon (CN); Teddy Yeung Man Lo, Kowloon (CN); Eddie Ping Kuen Li, Ma On Shan (CN)

(73) Assignee: Huizhou Light Engine Ltd., Huizhou (CN)

( * ) Notice: Subject to any disclaimer, the term of this patent is extended or adjusted under 35 U.S.C. 154(b) by 358 days.

(21) Appl. No.: 12/703,116

(22) Filed: Feb. 9, 2010

(65) Prior Publication Data
US 2010/0164409 A1 Jul. 1, 2010

Related U.S. Application Data

(63) Continuation-in-part of application No. 12/355,655, filed on Jan. 16, 2009, now Pat. No. 8,052,303, which is a continuation-in-part of application No. 11/854,145, filed on Sep. 12, 2007, now Pat. No. 7,988,332.

(60) Provisional application No. 60/844,184, filed on Sep. 12, 2006.

(51) Int. Cl.
*F21S 4/00* (2006.01)
*F21V 23/04* (2006.01)
*F21V 23/06* (2006.01)
*F21V 31/00* (2006.01)
*H05B 37/02* (2006.01)

(52) U.S. Cl.
USPC ...... 362/249.05; 362/231; 362/234; 362/267; 362/800; 315/312

(58) Field of Classification Search
USPC ............. 362/249.05, 249.02, 249.04, 249.08, 362/249.12, 227, 231, 234, 249.13, 267, 362/800; 315/291, 312, 318
See application file for complete search history.

(56) References Cited

U.S. PATENT DOCUMENTS

| 4,546,041 A | 10/1985 | Keane et al. |
| 4,761,720 A | 8/1988 | Solow |

(Continued)

FOREIGN PATENT DOCUMENTS

| CN | 1170109 A | 1/1998 |
| CN | 2708092 Y | 7/2005 |

(Continued)

OTHER PUBLICATIONS

EPO Espacenet machine English translation of cited DE10051526 A1, May 2, 2002, description only.

(Continued)

*Primary Examiner* — Alan Cariaso
(74) *Attorney, Agent, or Firm* — Schiff Hardin LLP

(57) ABSTRACT

Integrally formed LED light wires are provided, comprising a plurality of dynamically addressable LED modules, each LED module comprising one or more LEDs; a microcontroller; and one or more ports, said microcontroller being configured to: check a status of at least one of said one or more ports; if the status of the port corresponds to a predetermined state: assign the LED module to which said microcontroller belongs to a first display address, and send signals to said microcontroller of a neighboring LED module, said signals assigning respective further display address to the neighboring LED module. Such LED light wires can also include a display memory which stores current display information associated with each of said LED modules in said LED light wire, and a display controller, said display controller being configured to update the current display information stored in said display memory.

18 Claims, 25 Drawing Sheets

(56) References Cited

U.S. PATENT DOCUMENTS

| | | | |
|---|---|---|---|
| 5,392,200 | A | 2/1995 | Milde |
| 5,769,527 | A | 6/1998 | Taylor et al. |
| 5,848,837 | A | 12/1998 | Gustafson |
| 5,927,845 | A | 7/1999 | Gustafson et al. |
| 5,941,626 | A | 8/1999 | Yamuro |
| 6,074,074 | A | 6/2000 | Marcus |
| 6,113,248 | A | 9/2000 | Mistopoulos et al. |
| 6,541,800 | B2 | 4/2003 | Barnett et al. |
| 6,604,841 | B2 | 8/2003 | Liu |
| 6,673,277 | B1 | 1/2004 | Joseph et al. |
| 6,673,292 | B1 | 1/2004 | Gustafson et al. |
| 6,777,891 | B2 | 8/2004 | Lys et al. |
| 6,840,655 | B2 | 1/2005 | Shen |
| 6,866,394 | B1 | 3/2005 | Hutchins et al. |
| 6,874,904 | B2 | 4/2005 | Hsu |
| 6,933,444 | B2 | 8/2005 | Albert et al. |
| 7,015,825 | B2 | 3/2006 | Callahan |
| 7,021,792 | B2 | 4/2006 | Lin |
| 7,128,438 | B2 | 10/2006 | Ratcliffe |
| 7,140,751 | B2 | 11/2006 | Lin |
| 7,173,383 | B2 | 2/2007 | Vornsand et al. |
| 7,178,941 | B2 * | 2/2007 | Roberge et al. ............... 362/225 |
| 7,235,815 | B2 | 6/2007 | Wang |
| 7,273,300 | B2 | 9/2007 | Mrakovich |
| 7,400,029 | B2 | 7/2008 | Shimada et al. |
| 7,465,056 | B2 | 12/2008 | Peng |
| 7,508,141 | B2 | 3/2009 | Wong |
| 7,543,956 | B2 * | 6/2009 | Piepgras et al. ............. 362/257 |
| 7,701,151 | B2 | 4/2010 | Petrucci et al. |
| 7,948,190 | B2 | 5/2011 | Grajcar |
| 7,988,332 | B2 | 8/2011 | Lo et al. |
| 8,022,643 | B2 * | 9/2011 | Chan ........................... 315/312 |
| 8,052,303 | B2 | 11/2011 | Lo et al. |
| 2001/0036082 | A1 | 11/2001 | Kanesaka |
| 2004/0037079 | A1 | 2/2004 | Luk |
| 2005/0036310 | A1 | 2/2005 | Fan |
| 2005/0077525 | A1 | 4/2005 | Lynch et al. |
| 2005/0104059 | A1 | 5/2005 | Friedman et al. |
| 2005/0243556 | A1 | 11/2005 | Lynch |
| 2006/0180827 | A1 | 8/2006 | Wang |
| 2008/0137332 | A1 | 6/2008 | Lo et al. |
| 2009/0154156 | A1 | 6/2009 | Lo et al. |

FOREIGN PATENT DOCUMENTS

| | | |
|---|---|---|
| DE | 10051528 | 5/2002 |
| DE | 20216833 | 3/2004 |
| EP | 0760448 | 3/1997 |
| EP | 0 898 442 A1 | 2/1999 |
| EP | 0911573 | 4/1999 |
| JP | 61-182587 U | 11/1986 |
| JP | 11-191494 A | 7/1999 |
| JP | 11-249607 A | 9/1999 |
| JP | 2003-511817 A | 3/2003 |
| JP | 2008-513935 A | 5/2008 |
| TW | 200823409 A | 6/2008 |
| WO | WO-98/10219 A1 | 3/1998 |
| WO | WO-01/25681 A1 | 4/2001 |
| WO | WO-02/098182 A2 | 12/2002 |
| WO | WO-2008/031580 A1 | 3/2008 |

OTHER PUBLICATIONS

PCT Notification of Transmittal of The International Search Report and The Written Opinion of the International Searching Authority, or the Declaration issued in connection with related PCT International Application No. PCT/EP2010/0051784 dated Oct. 14, 2010.

PCT International Search Report issued in connection with related PCT International Application No. PCT/EP2010/0051784 dated Oct. 14, 2010.

PCT Notification of Transmittal of The International Search Report and The Written Opinion of the International Searching Authority, or the Declaration issued in connection with PCT International Application No. PCT/EP2007/007948 dated Feb. 14, 2008.

Written Opinion of the International Searching Authority dated May 29, 2009 in connection with PCT Application No. PCT/EP2009/050581.

Notification of Transmittal of the International Search Report and The Written Opinion of the International Searching Authority, or the Declaration dated May 29, 2009 in connection with PCT Application No. PCT/EP2009/050581.

International Search Report dated May 29, 2009 in connection with PCT Application No. PCT/EP2009/050581.

First Office Action issued by China's State Intellectual Property Office dated Nov. 27, 2009 in connection with Chinese Patent Application No. 200780001712.3.

Japanese Office Action issued for corresponding application JP 2011-245422, mailing date Nov. 6, 2012 (with English translation).

English translation of Korean Office Action issued Sep. 8, 2012 in connection with Korean Patent Application KR 10-2011-7009262.

* cited by examiner

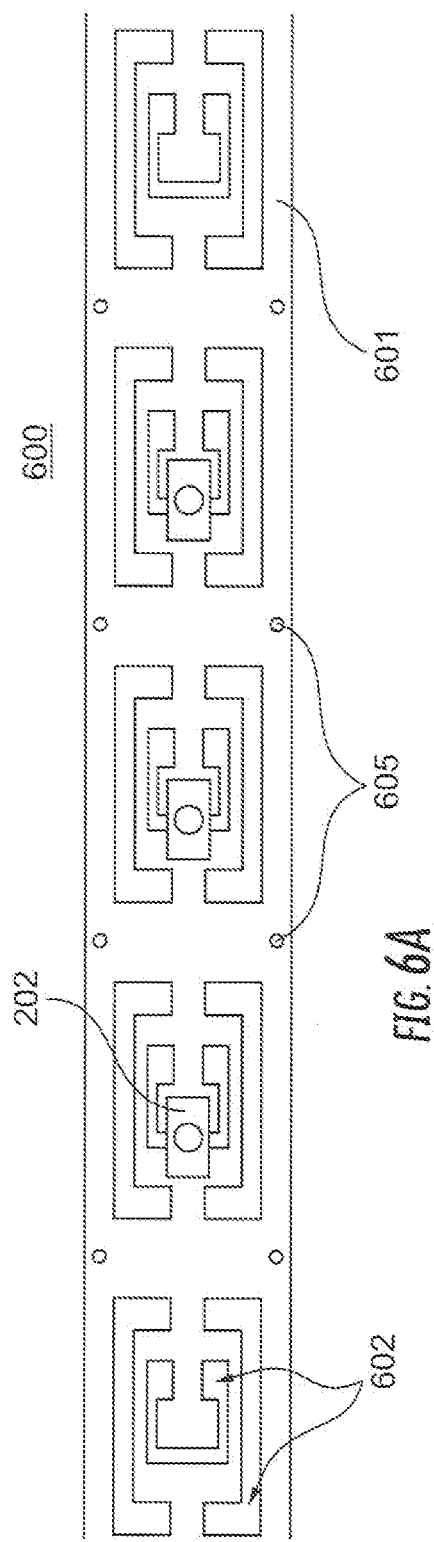
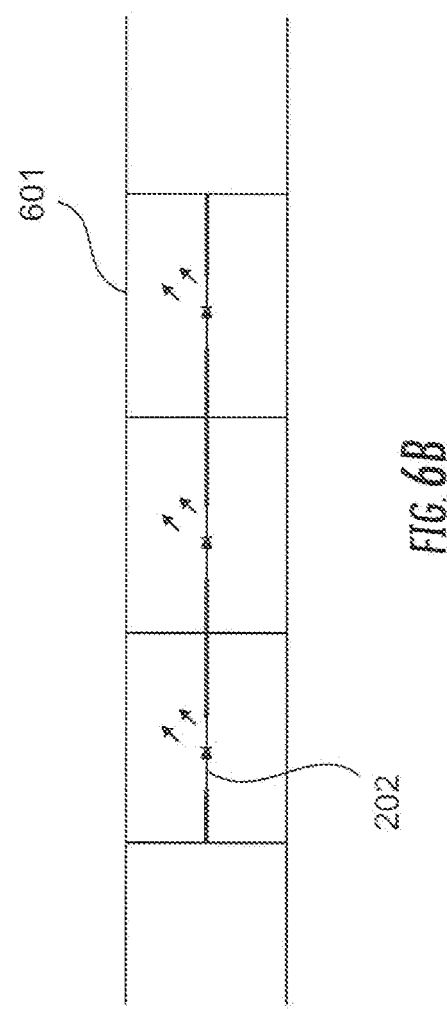
FIG. 6A
FIG. 6B

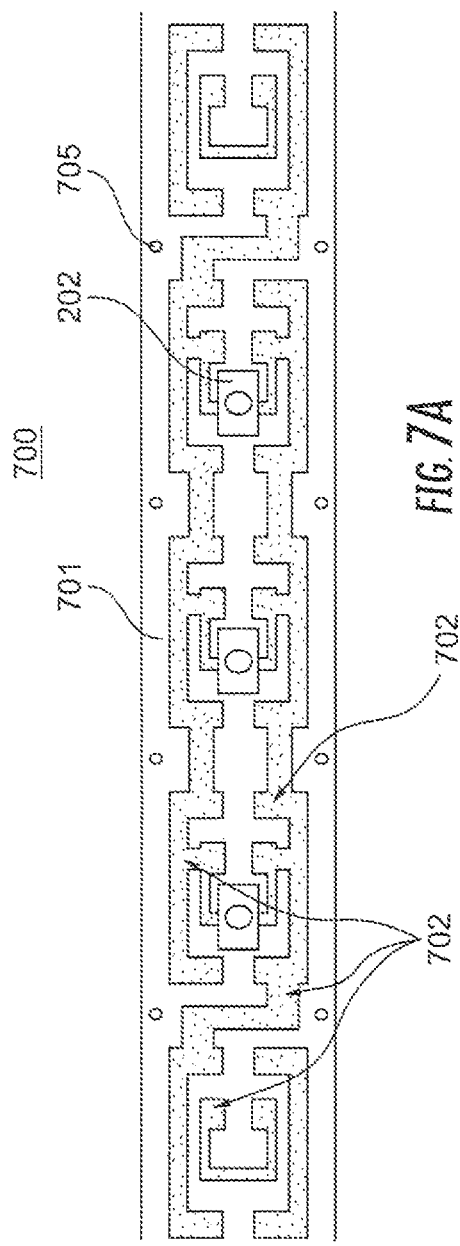
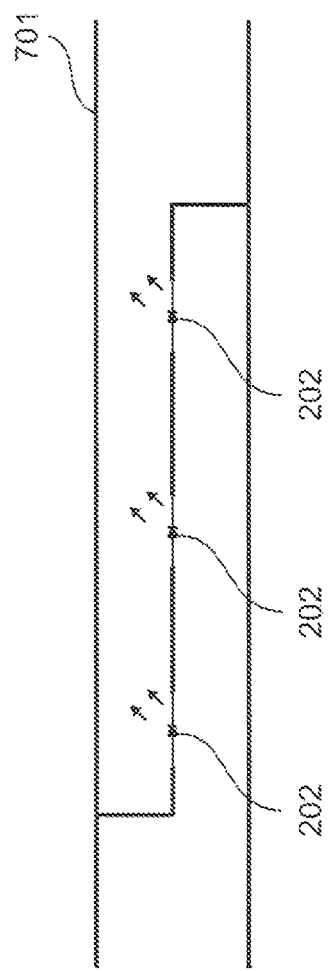

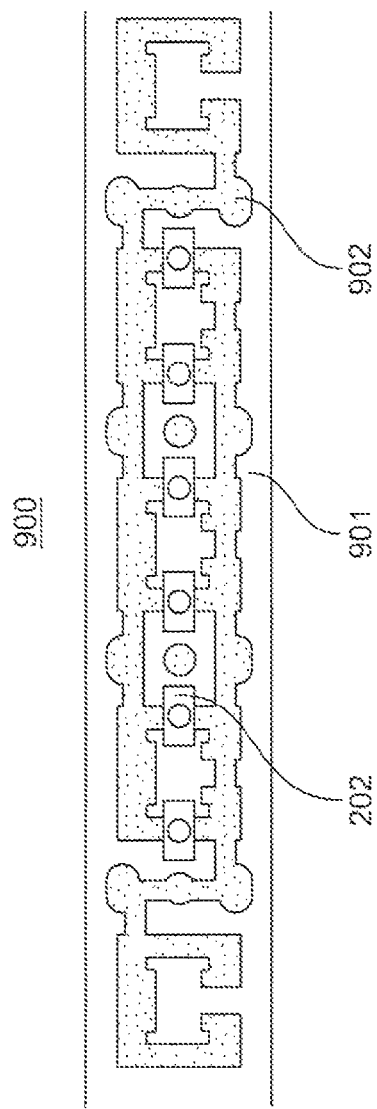
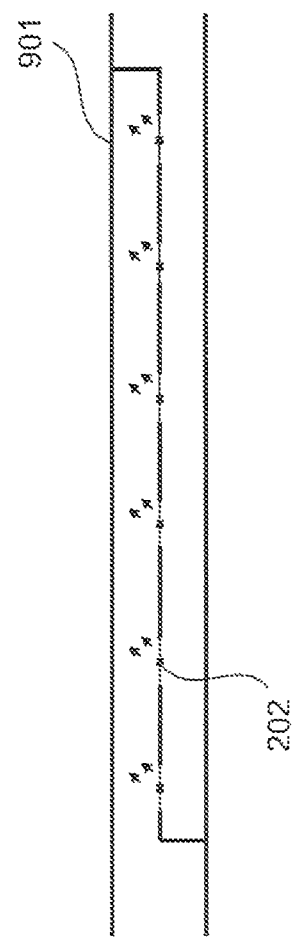
FIG. 9A
FIG. 9B

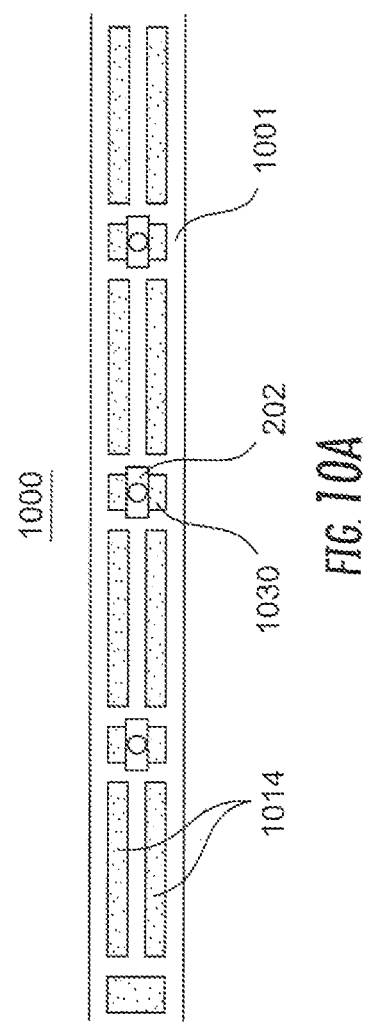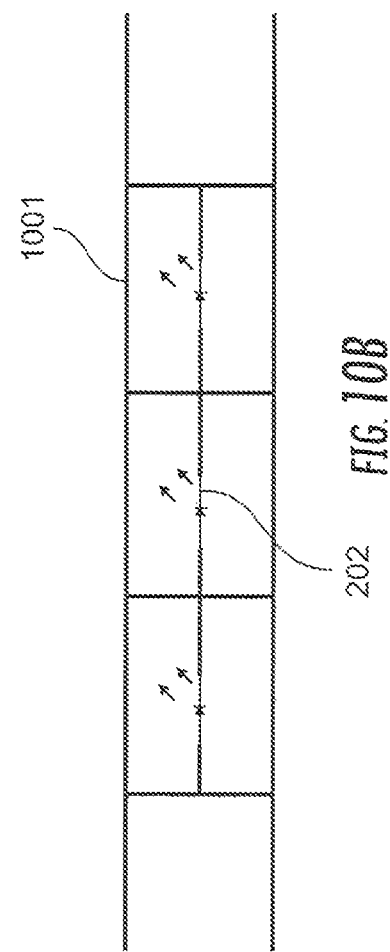

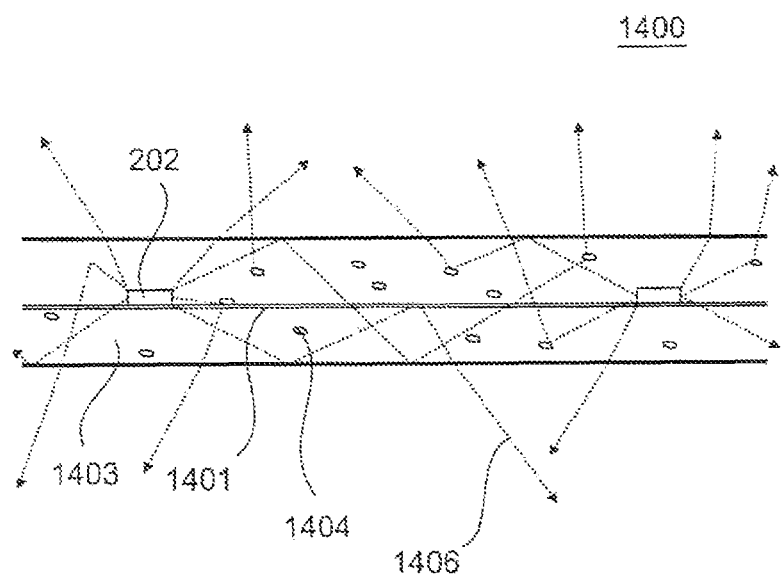
FIG. 14A
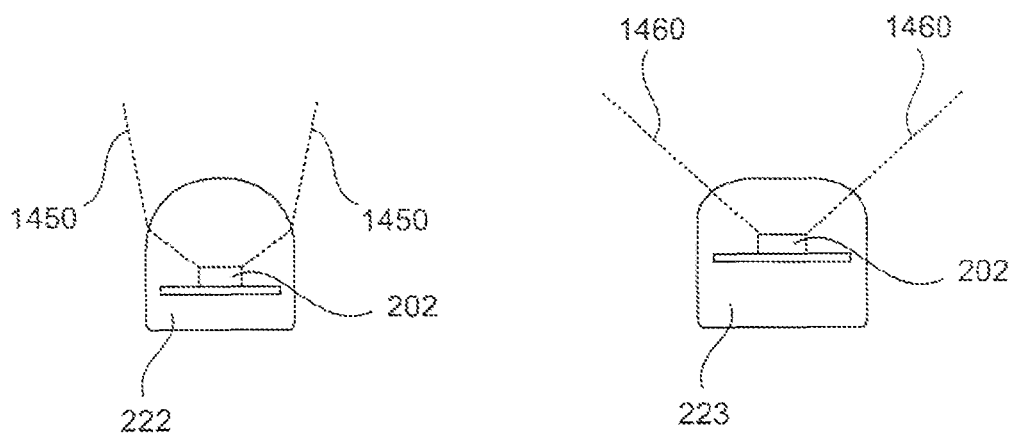
FIG. 14B
FIG. 14C

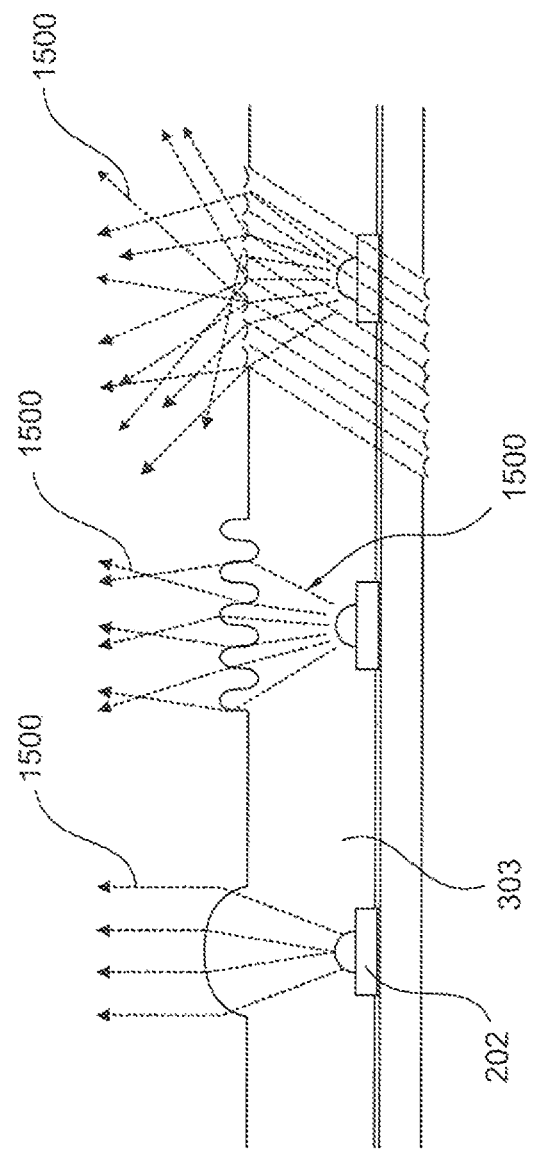

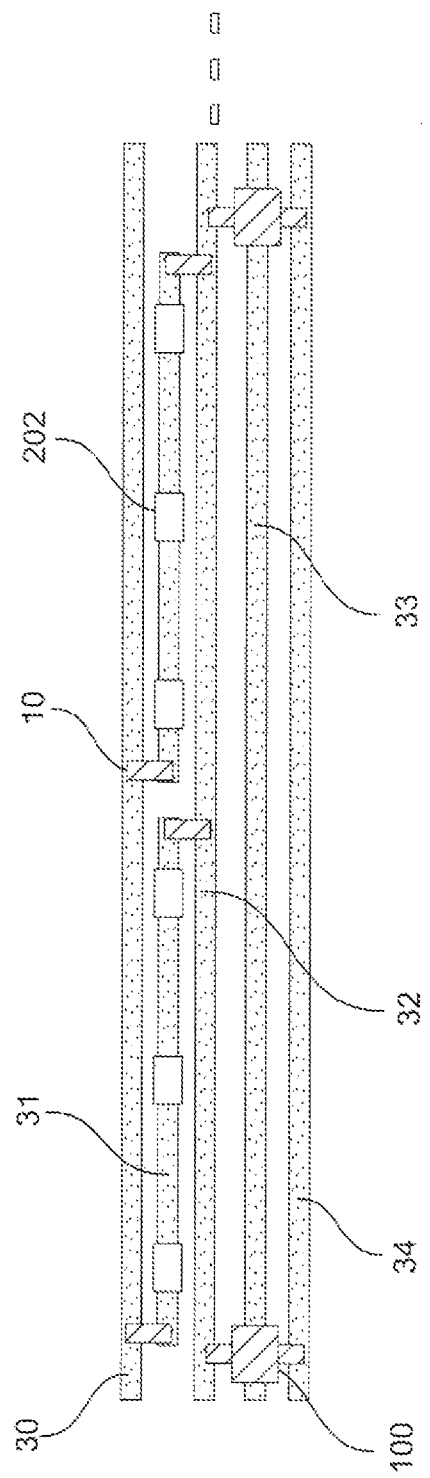

INTEGRALLY FORMED LIGHT EMITTING DIODE LIGHT WIRE AND USES THEREOF

CROSS-REFERENCE TO RELATED APPLICATIONS

This utility application is a continuation-in-part of U.S. Ser. No. 12/355,655, filed Jan. 16, 2009, which is a continuation-in-part of U.S. Ser. No. 11/854,145, filed Sep. 12, 2007, which claims priority to U.S. Provisional Patent Application Ser. No. 60/844,184, filed Sep. 12, 2006, the entirety of which is incorporated herein by reference.

Throughout this application, several publications are referenced. Disclosure of these references in their entirety is hereby incorporated by reference into this application.

The present invention relates to light wires and, more specifically, an integrally formed light wire containing light emitting diodes ("LEDs"), and the uses of such LED light wire, wherein the LEDs and associated circuitry of the LED light wire are protected from mechanical damage and environmental hazards, such as water and dust.

BACKGROUND THE INVENTION

Conventional incandescent or LED light wires are commonly used in a variety of indoor and outdoor decorative or ornamental lighting applications. For example, such conventional light wires are used to create festive holiday signs, outline architectural structures such as buildings or harbors, and provide under-car lighting systems. These light wires are also used as emergency lighting aids to increase visibility and communication at night or when conditions, such as power outages, water immersion and smoke caused by fires and chemical fog, render normal ambient lighting insufficient for visibility.

Conventional LED light wires consume less power, exhibit a longer lifespan, are relatively inexpensive to manufacture, and are easier to install when compared to light tubes using incandescent light bulbs. Increasingly, LED light wires are used as viable replacements for neon light tubing.

As illustrated in FIG. 1, conventional light wire 100 consists of a plurality of illuminant devices 102, such as incandescent light bulbs or LEDs, connected together by a flexible wire 101 and encapsulated in a protective tube 103. A power source 105 creates an electrical current that flows through the flexible wire 101 causing the illuminant devices 102 to illuminate and create an effect of an illuminated wire. The illuminant devices 102 are connected in series, parallel, or in combination thereof. Also, the illuminant devices 102 are connected with control electronics in such a way that individual illuminant devices 102 may be selectively switched on or off to create a combination of light patterns, such as strobe, flash, chase, or pulse.

In conventional light wires, the protective tube 103 is traditionally a hollow, transparent or semi-transparent tube which houses the internal circuitry (e.g., illuminant devices 102; flexible wire 101). Since there is an air gap between the protective tube 103 and internal circuitry, the protective tube 103 provides little protection for the light wire against mechanical damage due to excessive loads, such as the weight of machinery that is directly applied to the light wire. Furthermore, the protective tube 103 does not sufficiently protect the internal circuitry from environmental hazards, such as water and dust. As a result, these conventional light wires 100 with protective tube 103 are found unsuitable for outdoor use, especially when the light wires are exposed to extreme weather and/or mechanical abuse.

In conventional light wires, wires, such as flexible wire 101, are used to connect the illuminant devices 102 together. In terms of manufacturing, these light wires are traditionally pre-assembled using soldering or crimp methods and then encapsulated via a conventional sheet or hard lamination process in protective tube 103. Such manufacturing processes are labor intensive and unreliable. Furthermore, such processes decrease the flexibility of the light wire.

In response to the above-mentioned limitations associated with conventional light wires and the manufacture thereof, LED light strips have been developed with increased complexity and protection. These LED light strips consist of circuitry including a plurality of LEDs mounted on a support substrate containing a printed circuit and connected to two separate electrical conductors or bus elements. The LED circuitry and the electrical conductors are encapsulated in a protective encapsulant without internal voids (which includes gas bubbles) or impurities, and are connected to a power source. These LED light strips are manufactured by an automated system that includes a complex LED circuit assembly process and a soft lamination process. Examples of these LED light strips and the manufacture thereof are discussed in U.S. Pat. Nos. 5,848,837, 5,927,845 and 6,673,292, all entitled "Integrally Formed Linear Light Strip With Light Emitting Diode"; U.S. Pat. No. 6,113,248, entitled "Automated System For Manufacturing An LED Light Strip Having An Integrally Formed Connected"; and U.S. Pat. No. 6,673,277, entitled "Method of Manufacturing a Light Guide".

Although these LED light strips are better protected from mechanical damage and environmental hazards, these LED light strips only provide one-way light direction, and are limited to two separate bus elements in its internal LED circuitry. Also, the manufacturing of such LED light strips remains expensive and time-consuming since these LED light strips at least require a protective encapsulant free of internal voids and impurities, as well as crimping each LED connector pin to the internal LED circuitry. Further, the lamination process makes these LED light strips too rigid to bend.

SUMMARY OF THE INVENTION

In light of the above, there exists a need to further improve the art. Specifically, there is a need for an improved integrally formed LED light wire that is flexible and provides a smooth, uniform lighting effect from all directions of the integrally formed LED light wire. There is also a need for an LED light wire with additional lighting functions which is manufactured by a low cost, time-efficient automated process. Furthermore, there is a need for a LED light wire which intelligently recognizes, responds and adapts to changes associated with installation, maintenance and failure detection.

In consideration of the above problems, in accordance with a first aspect of the present invention, an integrally formed LED light wire is provided, comprising a plurality of LED modules, each LED module comprising one or more LEDs; a microcontroller; and one or more ports, said microcontroller being configured to: check a status of at least one of said one or more ports; if the status of the port corresponds to a predetermined state: assign the LED module to which said microcontroller belongs to a first display address, and send signals to said microcontroller of a neighboring (or adjacent) LED module, said signals assigning respective further display address to the neighboring LED module.

In another aspect, the integrally formed LED wire further comprises a display memory, electrically coupled to said plurality of LED modules, said display memory storing current display information associated with each of said LED modules in said integrally formed LED light wire, said current display information stored in said display memory being accessible by each of the microcontrollers of the LED modules, such that said microcontrollers can retrieve current display information.

In another aspect, the integrally formed LED light wire further comprises a display controller, said display controller being configured to update the current display information stored in said display memory.

In another aspect, the one or more LEDs in each said LED module comprise a red, blue, green or white LED. In another aspect, the one or more LEDs in each said LED module can also be either red, blue and green LEDs, or red, blue, green and white LEDs.

In yet another aspect, the present invention is directed to an integrally formed LED light wire, comprising a first bus element formed from a conductive material adapted to distribute power from a power source; a second bus element formed from a conductive material adapted to transmit a control signal; a third bus element formed from a conductive material adapted as a ground; at least two LED modules, each of said LED modules comprising a microcontroller and at least one LED, said LED module being electrically coupled to said first, second and third bus elements; one or more ports, said microcontroller being configured to check a status of at least one of said one or more ports, and if the status of the port corresponds to a predetermined state: assign said LED module to which said microcontroller belongs to a first display address, and send signals to the microcontroller of a neighboring LED module, said signals assigning respective further display address to said neighboring LED module.

In another aspect, the integrally formed LED light wire further comprises a display memory, electrically coupled to said at least two LED modules, said display memory storing current display information associated with each of the LED modules, said current display information stored in said display memory being accessible by each of the microcontrollers of the LED modules, such that said microcontrollers can retrieve current display information.

In another aspect, the integrally formed LED light wire further comprises a display controller, said display controller being configured to update the current display information stored in said display memory.

In another aspect, the first, second and third bus elements are made of braided wire.

In another aspect, the integrally formed LED light wire further comprises an encapsulant completely encapsulating said first, second, and third bus elements, and said at least two LED modules. In another aspect, the encapsulant further comprises light scattering particles.

In yet another aspect, the present invention is directed to an integrally formed LED light wire, comprising a support substrate; a conductive base mounted on said support substrate, said conductive base comprising a first, second and third conductive bus elements, wherein said first conductive bus element is adapted to distribute power from a power source, said second conductive bus element is adapted to transmit a control signal, and said third conductive bus element is adapted as a ground; at least two LED modules, each of said LED modules, comprising a microcontroller and at least one LED, said LED modules being electrically coupled to said first, second and third conductive bus elements; one or more ports; said microcontroller being configured to check a status of at least one of the one or more ports, and if the status of the port corresponds to a predetermined state: assign the LED module to which said microcontroller belongs to a first display address, and send signals to the microcontroller of a neighboring LED module, said signals assigning respective further display address to the neighboring LED module; and a display memory, electrically coupled to said at least two LED modules, said display memory storing a current display information for each of said LED modules, said current display information stored in said display memory being accessible by each LED module, such that said LED modules can request and retrieve current display information.

In another aspect, the integrally formed LED light wire further comprises an encapsulant completely encapsulating said support substrate, said conductive base, said at least two LED modules. The encapsulant can include light scattering particles.

In another aspect, the integrally formed LED light wire further comprises at least one sensor or detector coupled to any one of conductive bus elements.

In another aspect, the outer profile of the encapsulant comprises an alignment key and an alignment keyhole located at opposite sides of the integrally formed LED light wire.

In yet another aspect, the present invention is directed to a lighting panel comprising a plurality of the integrally formed LED light wires mentioned above, having an outer profile of the encapsulant comprising an alignment key and an alignment keyhole located at opposite sides of the integrally formed LED light wire.

BRIEF DESCRIPTION OF THE FIGURES

For the purposes of illustrating the present invention, the drawings reflect a form which is presently preferred; it being understood however, that the invention is not limited to the precise form shown by the drawings in which:

FIG. 6A is an embodiment of a conductive base;

FIG. 6B is a schematic diagram of the conductive base of FIG. 6A;

FIG. 7A is another embodiment of a conductive base;

FIG. 7B is a schematic diagram of the conductive base of FIG. 7A;

FIG. 9A is another embodiment of a conductive base;

FIG. 9B is a schematic diagram of the conductive base of FIG. 9A;

FIG. 10A is another embodiment of a conductive base;

FIG. 10B is a schematic diagram of the conductive base of FIG. 10A;

FIG. 14A depicts the optical properties of an integrally formed LED light wire according to an embodiment of the present invention;

FIG. 14B depicts a cross-sectional view of a dome-shaped encapsulant and the optical properties thereof;

FIG. 14C depicts a cross-sectional view of a flat-top-shaped encapsulant and the optical properties thereof;

FIGS. 15A-C depict a cross-sectional view of three different surface textures of the encapsulant;

FIG. 18 is a block diagram illustrating an integrally formed LED light wire containing at least a sensor or detector according to an embodiment of the present invention;

DETAILED DESCRIPTION OF THE INVENTION

The present invention relates to an integrally formed LED light wire containing a plurality of LEDs that are connected in series, parallel or a combination thereof on at least one conductive bus element which forms a mounting base or on at least two conductive bus elements mounted on a support substrate made of insulating material (e.g., plastic) to provide a mounting base. The mounting base provides electrical connection and a physical mounting platform or a mechanical support for the LEDs. The mounting base can also act as or include a light reflector for the LEDs. The mounting base and LEDs are encapsulated in a transparent or semi-transparent encapsulant which may contain light scattering particles.

Figure 1:
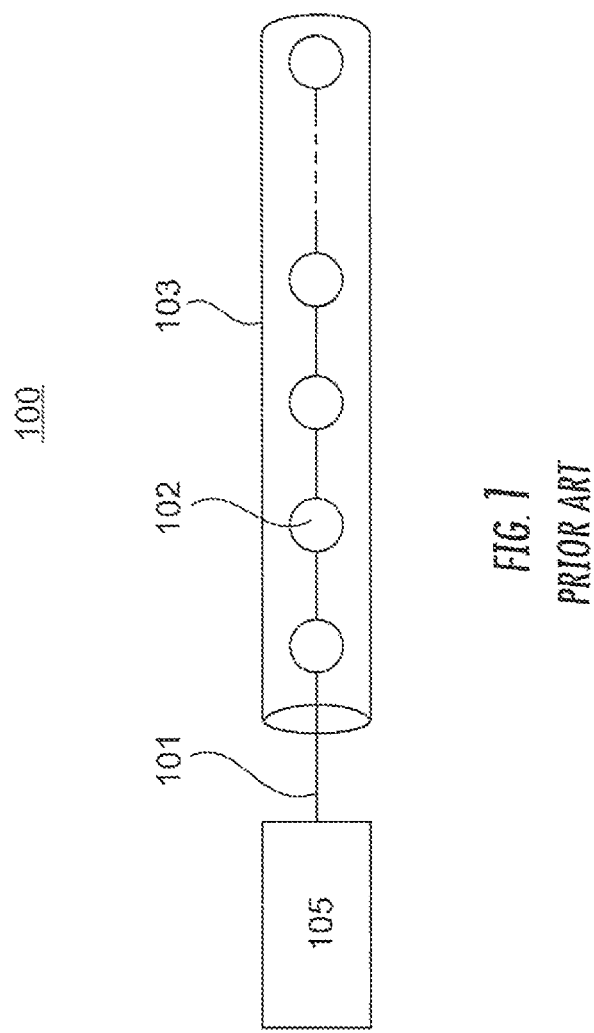
FIG. 1 is a representation of a conventional light wire.
Figure 2:
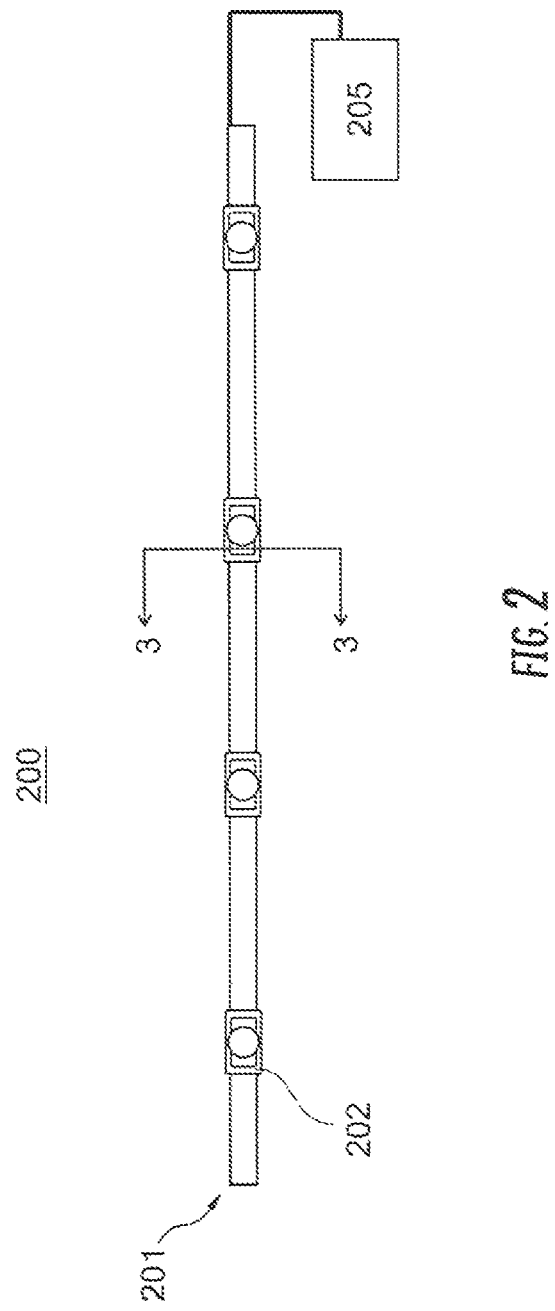
FIG. 2 is a top view illustrating an integrally formed LED light wire according to an embodiment of the present invention.
Figure 3:
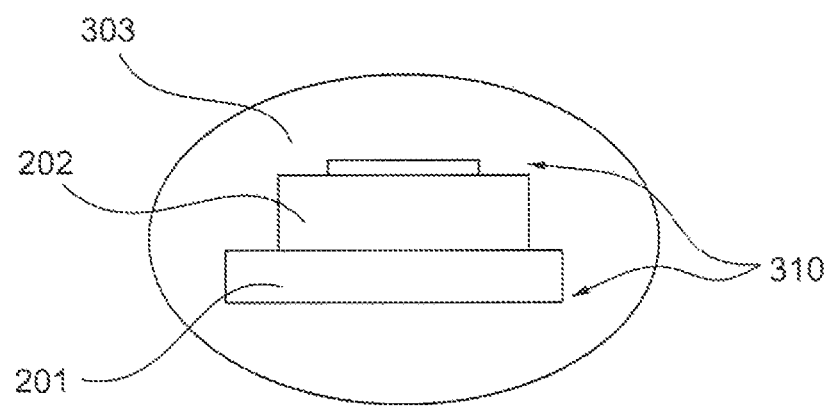
FIG. 3 is a cross-sectional view of the integrally formed LED light wire shown in FIG. 2.

In one embodiment of the present invention, as shown in FIGS. 2 and 3, an integral LED light wire, which includes a sub-assembly 310 comprising at least one LED 202 connected to a conductive base 201, the sub-assembly 310 is encapsulated within an encapsulant 303, and the conductive base 201 comprises one conductive bus element formed from a conductive material capable of distributing power from a power source. As shown in FIG. 2, the LEDs 202 are connected in series. This embodiment offers the advantage of compactness in size, and allows the production of a long, thin LED light wire with an outer diameter of 3 mm or less. The conductive base 201 is operatively connected to a power source 205 to conduct electricity.

Figure 4A:
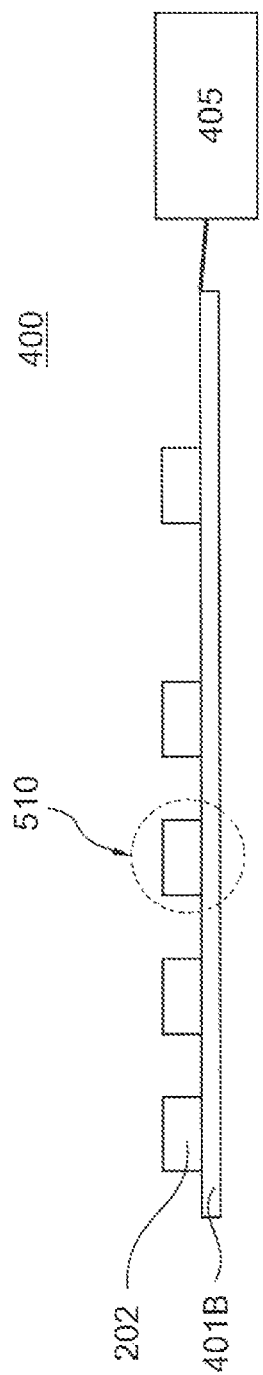
FIG. 4A is a side view of an integrally formed LED light wire according to another embodiment of the present invention.
Figure 4B:
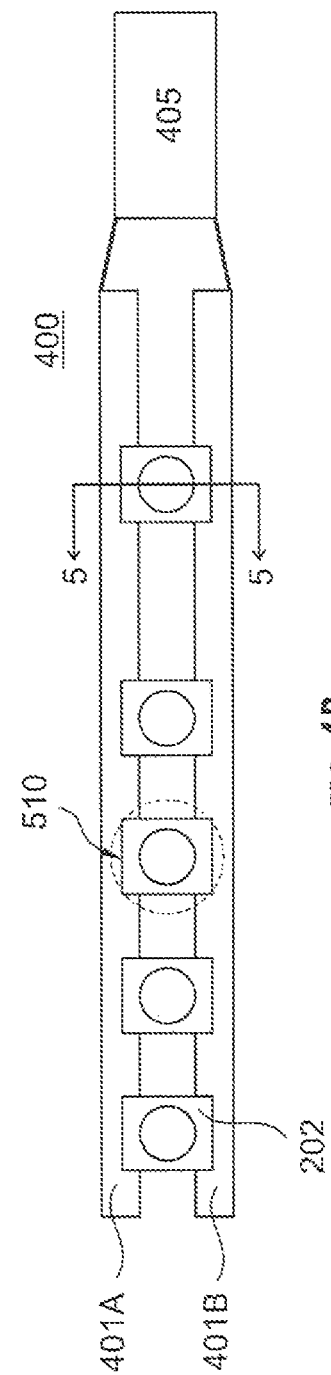
FIG. 4B is a top view of the integrally formed LED light wire shown in FIG. 4B.
Figure 5A:
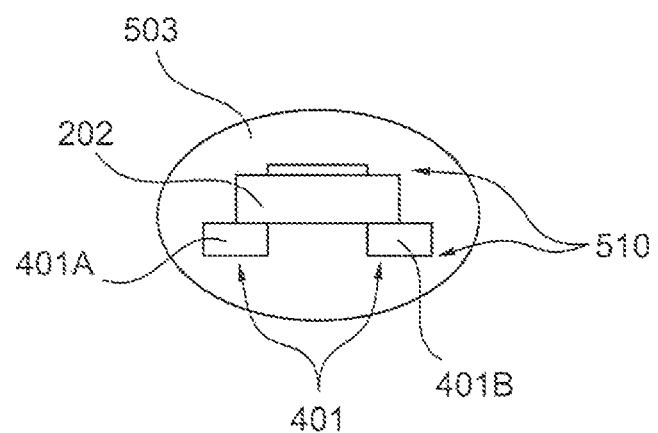
FIG. 5A is a cross-sectional view of the integrally formed LED light wire shown in FIGS. 4A & 4B.

In another embodiment, as illustrated in FIGS. 4A, 4B, and 5A, the present invention may be an integrally formed LED light wire 400 comprising a plurality of sub-assemblies 510. Each sub-assembly 510 comprises at least one LED 202 connected to a conductive base 401, wherein the conductive base 401 has two conductive bus elements 401A and 401B. The sub-assemblies 510 are encapsulated within an encapsulant 503. As shown, the LEDs 202 are connected in parallel. The conductive base 401 is operatively connected to a power source 405 to activate LEDs 202.

Figure 5B:
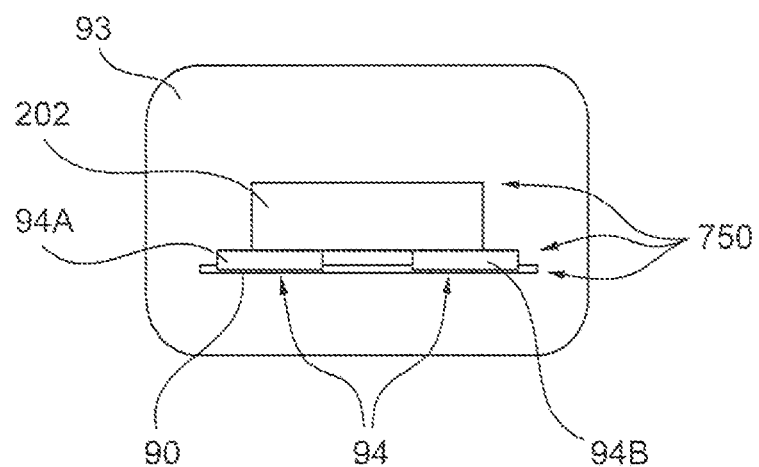
FIG. 5B is a cross-sectional view of an integrally formed LED light wire according to another embodiment of the present invention.

In another embodiment, as shown in FIG. 5B, the present invention may include a plurality of sub-assemblies 750. Each sub-assembly 750 includes at least one LED 202 (for example, a SMD-On-Board LED) connected to a conductive base 94 having at least two conductive bus elements 94A and 94B, wherein the conductive base 94 is mounted on a support substrate 90.

AC or DC power from a power source, such as power source 405, may be used to power the integrally formed LED light wire. Additionally, a current source may be used. Brightness may be controlled by digital or analog controllers.

The conductive base 94, 201, 401 extends longitudinally along the length of the integrally formed LED light wire, and act as an electrical conductor, and as a physical mounting platform or a mechanical support for the LEDs 202. The conductive base can also act as or include a light reflector for the LEDs 202.

The conductive base 201, 401 may be, for example, punched, stamped, printed, silk-screen printed, or laser cut, or the like, from a metal plate or foil to provide the basis of an electrical circuit, and may be in the form of a thin film or flat strip. The conductive bus elements of conductive base 94, 201, 401, and conductive segments (discussed below) may also be formed using rigid electrical conductive materials (such as metal rod, metal strip, copper plate, copper clad steel plate, metal strip, a rigid base material coated with an electrically conductive material, or the like), or flexible electrical conductive materials (such as thin metal strip, copper clad alloy wire, stranded wire, braided wire, or the like). Stranded wire or braided wire may be flat or round, and comprises a plurality of electrical conductive fine wires made of copper, brass, aluminum, or the like; such fine wires may be bare or coated with electrical conductive materials including, but not limited to, tin, nickel, silver, or the like. Metal, mentioned in this paragraph, may include copper, brass, aluminum, or the like.

In a preferred embodiment, flat braided wire is used as conductive bus elements or conductive segments, said conductive bus elements or conductive segments are flexible. The use of flat braided wire in the present invention promotes increased flexibility in a direction perpendicular to the length of the flat conductive bus elements. Also, flat braided wire provides higher thermal conductivity to dissipate more efficiently the heat from the LEDs, thereby allowing the present invention to operate at higher power and achieve greater brightness than conventional light wires with solid flat strips.

Also, generally speaking, the maximum length of the LED light wires is determined by the conductivity of the conductive bus elements. In conventional LED light wires, the voltage drop in the power bus increases as the LED light wires becomes longer due to its resistance and increasing current flow drawn by the increasing load of additional LEDs. Eventually, the voltage drop becomes too great at a particular maximum length of the LED light wire. In an aspect of the present invention, the maximum length of the integrally formed LED light wire can be increased by increasing the cross-sectional area of the conductive bus (e.g., increasing the gauge of braided wire used as conductive bus elements or segments), thereby reducing its resistance per unit length.

The conductive bus elements of conductive base 94 may be mounted on a support substrate 90 via adhesion, lamination, extrusion, or casting. The support substrate 90 may be made of rigid or flexible plastic, such as polyethylene terephthalate (PET), polyvinyl chloride (PVC), and thermoplastic polyurethane (TPU).

Additional circuitry, such as active or passive control circuit components (e.g., a microprocessor, a resistor, a capacitor), may be added and encapsulated within an encapsulant to add functionality to the integrally formed LED light wire. Such functionality may include, but not limited to, current limiting (e.g., resistor 10), protection, flashing capability, or brightness control. For example, a microcontroller or microprocessor may be included to make the LEDs 202 individually addressable; thereby, enabling the end user to control the illumination of selective LEDs 202 in the LED light wire to form a variety of light patterns, e.g., strobe, flash, chase, or pulse. In one embodiment, external control circuitry is connected to the conductive base 94, 201, 401.

First Embodiment of the Conductive Base

In a first embodiment of the conductive base assembly 600, shown in FIG. 6A, the base material of the conductive base 601 is preferably a long thin narrow metal strip or foil. In one embodiment, the base material is copper. A hole pattern 602, shown as the shaded region of FIG. 6A, depict areas where material from the conductive base 601 has been removed. In one embodiment, the material has been removed by a punching machine. The remaining material of the conductive base 601 forms the circuit of the present invention. Alternatively, the circuit may be printed on the conductive base 601 and then an etching process is used to remove the areas 602. The pilot holes 605 on the conductive base 600 act as a guide for manufacture and assembly.

The LEDs 202 are mounted either by surface mounting or LED chip bonding and soldered, welded, riveted or otherwise electrically connected to the conductive base 601 as shown in FIG. 6A. The mounting and soldering of the LEDs 202 onto the conductive base 601 not only puts the LEDs 202 into the circuit, but also uses the LEDs 202 to mechanically hold the different unpunched parts of the conductive base 601 together. In this embodiment of the conductive base 601 all of the LEDs 202 are short-circuited, as shown in FIG. 6B. Thus, additional portions of conductive base 601 are removed as discussed below so that the LEDs 202 are not short-circuited. In one embodiment, the material from the conductive base 601 is removed after the LEDs 202 are mounted.

Second Embodiment of the Conductive Base

To create series and/or parallel circuitries, additional material is removed from the conductive base. For example, additional portions of the conductive base are removed between the terminals of the LEDs 202 after the LEDs 202 are mounted on the conductive base; thereby, creating at least two conductors wherein each conductor is electrically separate, but then coupled to each other via the LEDs 202. As shown in FIG. 7A, the conductive base 701 has an alternative hole pattern 702 relative to the hole pattern 602 depicted in FIG. 6A. With the alternative hole pattern 702, the LEDs 202 (such as the three shown in FIGS. 7A and 7B) are connected in series on the conductive base 701. The series connection is shown in FIG. 7B, which is a schematic diagram of the conductive base assembly 700 shown in FIG. 7A. As shown, the mounting portions of LEDs 202 provide support for the conductive base 701.

Third Embodiment of the Conductive Base

Figure 8A:
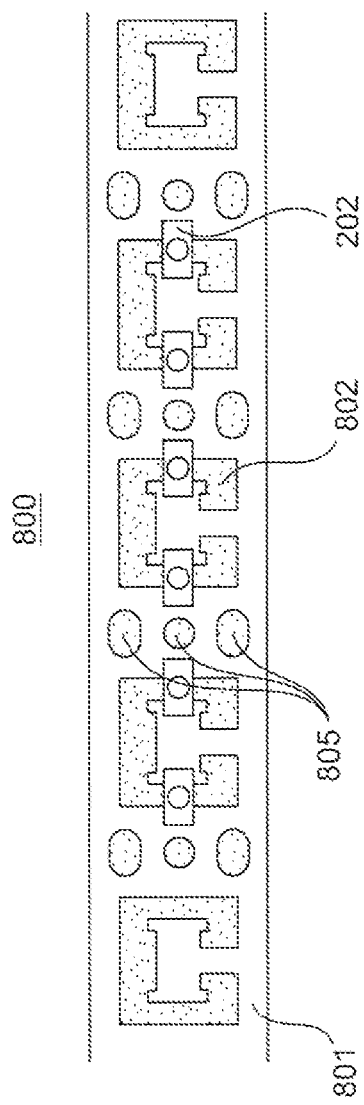
FIG. 8A is another embodiment of a conductive base.
Figure 8B:
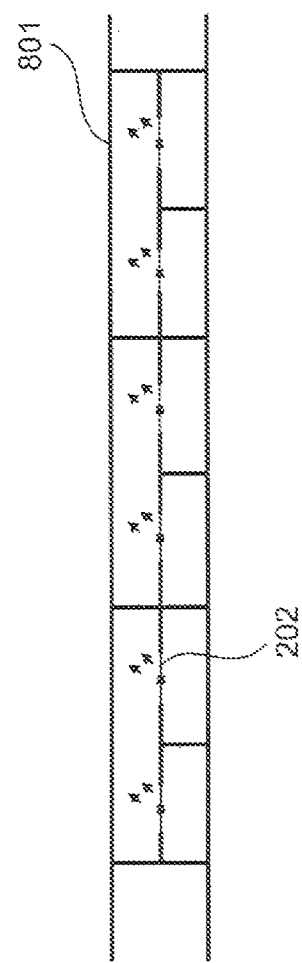
FIG. 8B is a schematic diagram of the conductive base of FIG. 8A.

In a third embodiment of the conductive base, as shown in FIG. 8A, a conductive base assembly 800 is depicted having a pattern 802 that is punched out or etched into the conductive base 801. Pattern 802 reduces the number of punched-out gaps required and increase the spacing between such gaps. Pilot holes 805 act as a guide for the manufacturing and assembly process. As shown in FIG. 8B, the LEDs 202 are short-circuited without the removal of additional material. In one embodiment, the material from conductive base 801 is removed after the LEDs 202 are mounted.

Fourth Embodiment of the Conductive Base

As illustrated in FIG. 9A, a fourth embodiment of the conductive base assembly 900 contains an alternative hole pattern 902 that, in one embodiment, is absent of any pilot holes. Compared to the third embodiment, more gaps are punched out in order to create two conducting portions in the conductive base 901. Thus, as shown in FIG. 9B, this embodiment has a working circuit where the LEDs 202 connected in series.

Fifth and Sixth Embodiments of the Conductive Base

FIG. 10A illustrates a fifth embodiment of conductive base assembly 1000 of the conductive base 1001. Shown is a thin LED light wire with a typical outer diameter of 3 mm or less. As shown in FIG. 10A, (1) the LEDs 202 connected on the conductive base 1001 are placed apart, preferably at a predetermined distance. In a typical application, the LEDs 202 are spaced from 3 cm to 1 m, depending upon, among other things, at least the power of the LEDs used and whether such LEDs are top or side-emitting. The conductive base 1001 is shown absent of any pilot holes. The punched-out gaps that create a first hole pattern 1014 that are straightened into long thin rectangular shapes. The gaps 1030 under the LEDs 202 are punched out after the LEDs 202 are mounted to conductive base 1001, or, in the alternative, LEDs 202 are mounted over punched-out gaps 1030. However, as shown in FIG. 10B, the resultant circuit for this embodiment is not useful since all the LEDs 202 are short-circuited. In subsequent procedures, additional material is removed from conductive base 1001 so that LEDs 202 are in series or parallel as desired.

Figure 11A:
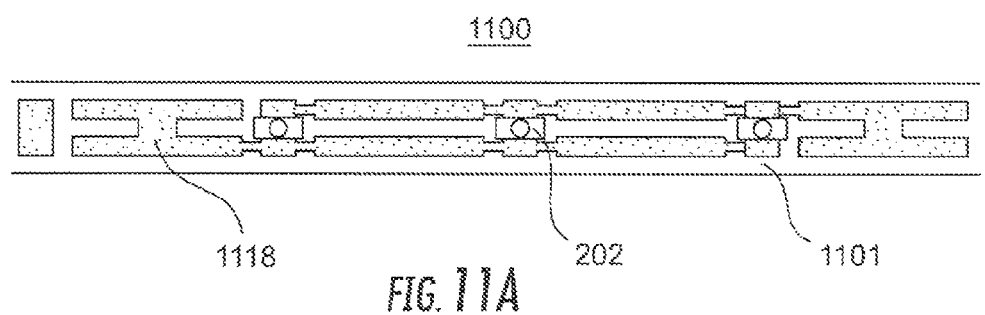
FIG. 11A is another embodiment of a conductive base.
Figure 11B:
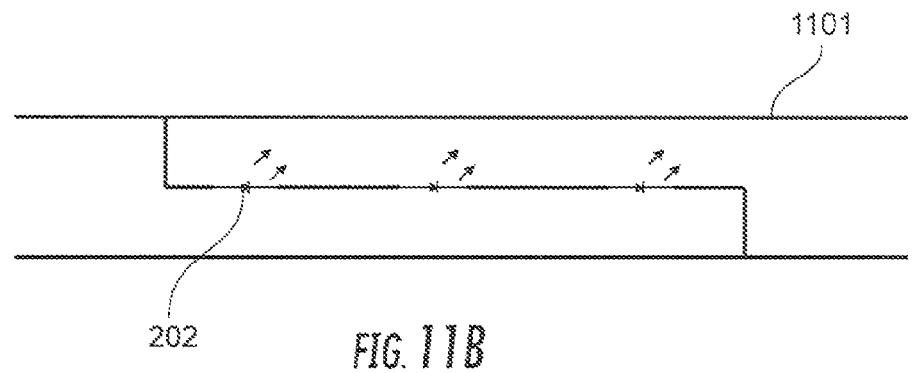
FIG. 11B is a schematic diagram of the conductive base of FIG. 11A.

In the sixth embodiment of the conductive base assembly 1100, conductive base 1101, as shown in FIG. 11A, contains a hole pattern 1118 which creates a working circuit in the conductive base 1101 with a series connections of LEDs 202 mounted onto the conductive base 1101. This embodiment is useful in creating a thin LED light wire with a typical outside diameter of 3 mm or less.

LEDs

The LEDs 202 may be, but are not limited to, individually-packaged LEDs, chip-on-board ("COB") LEDs, leaded LEDs, surface mount LEDs, SMD-On-Board LEDs, or LED dies individually die-bonded to the conductive base 301. The PCB for COB LEDs and SMD-On-Board LEDs may be, for example, FR4 PCB, flexible PCB, or metal-core PCB. The LEDs 202 may also be top-emitting LEDs, side-emitting LEDs, or a combination thereof.

The LEDs 202 are not limited to single colored LEDs. Multiple-colored LEDs may also be used. For example, if Red/Blue/Green LEDs (RGB LEDs) are used to create a pixel, combined with a variable luminance control, the colors at each pixel can combine to form a range of colors.

Mounting of LEDs onto the Conductive Base

As indicated above, LEDs 202 are mounted onto the conductive base by methods known in the art, including surface mounting, LED chip bonding, spot welding and laser welding.

Figure 12A:
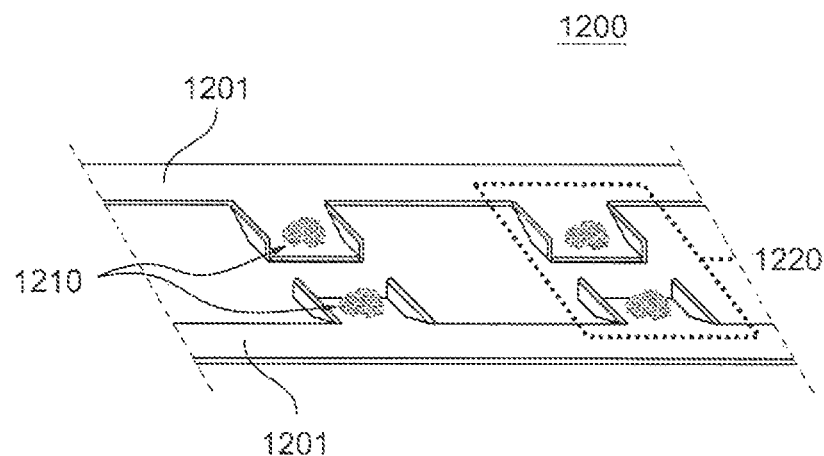
FIG. 12A depicts an embodiment of an LED mounting area of a conductive base.
Figure 12B:
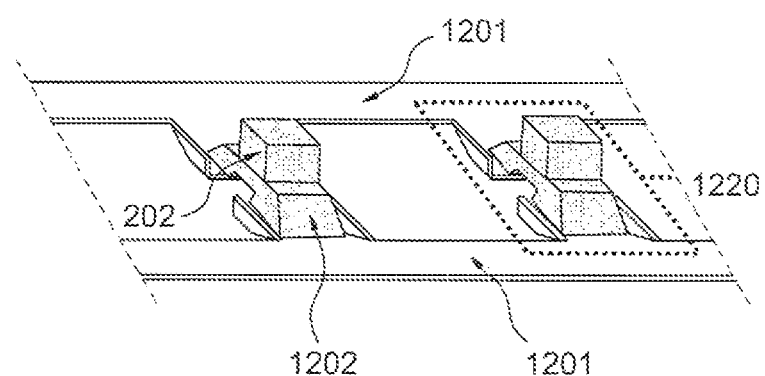
FIG. 12B depicts an LED mounted on the LED mounting area shown in FIG. 12A.

In surface mounting, as shown in FIGS. 12A and 12B, the conductive base 1201 is first punched to assume any one of the embodiments discussed above, and then stamped to create an LED mounting area 1210. The LED mounting area 1210 shown is exemplary, and other variations of the LED mounting area 1210 are possible. For example, the LED mounting area 1210 may be stamped into any shape which can hold an LED 202, or not stamped.

A soldering material 1210 (e.g., liquid solder; solder cream; solder paste; and any other soldering material known in the art) or conductive epoxy is placed either manually or by a programmable assembly system in the LED mounting area 1220, as illustrated in FIG. 12A. LEDs 202 are then placed either manually or by a programmable pick and place station on top of the soldering material 1210 or a suitable conductive epoxy. The conductive base 1201 with a plurality of LEDs 202 individually mounted on top of the soldering material 1210 may directly go into a programmable reflow chamber where the soldering material 1210 is melted or a curing oven where the conductive epoxy is cured. As a result, the LEDs 202 are bonded to the conductive base 1201 as shown in FIG. 12B.

Figure 13:
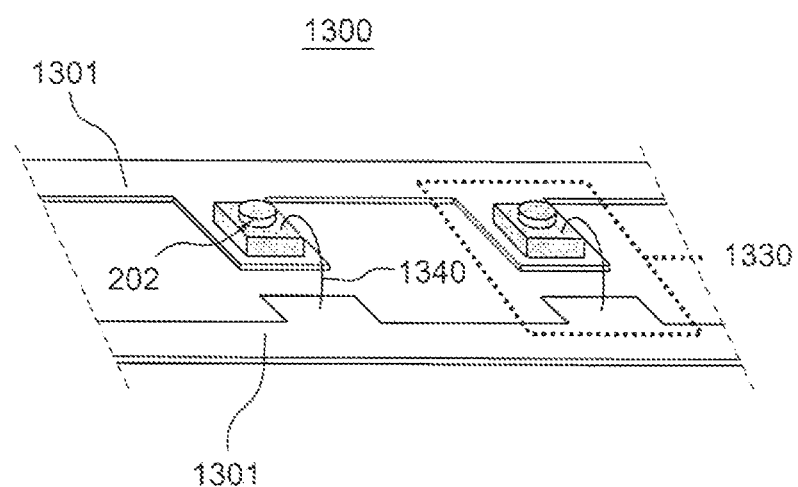
FIG. 13 depicts LED chip bonding in another embodiment of an LED mounting area.

As illustrated in FIG. 13, LEDs 202 may be mounted onto the conductive base 1301 by LED chip bonding. The conductive base 1301 is stamped to create a LED mounting area 1330. The LED mounting area 1330 shown in FIG. 13 is exemplary, and other variations of the LED mounting area 1330, including stamped shapes, like the one shown in FIG. 12A, which can hold an LED, are envisioned. LEDs 202, preferably an LED chip, are placed either manually or by a programmable LED pick place machine onto the LED mounting area 1330. The LEDs 202 are then wire bonded onto the conductive base 1301 using a wire 1340. It should be noted that wire bonding includes ball bonding, wedge bonding, and the like. Alternatively, LEDs 202 may be mounted onto the conductive base 301 using a conductive glue or a clamp.

It should be noted that the conductive base in the above embodiments can be twisted in an "S" shape. Then, the twisting is reversed in the opposite direction for another predetermined number of rotations; thereby, making the conductive base form a shape of a "Z". This "S-Z" twisted conductive base is then covered by an encapsulant. With its "S-Z" twisted placement, this embodiment will have increased flexibility, as well as emit light uniformly over 360°.

Figure 11C:
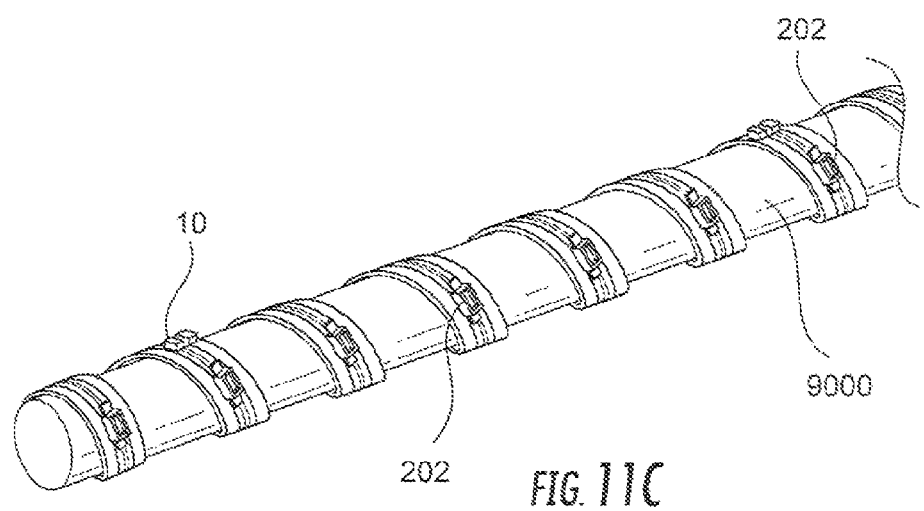
FIG. 11C depicts an embodiment of a conductive base wrapped on a core prior to encapsulation.

In another embodiment, as shown in FIG. 11C, conductive base (e.g., conductive base 1101) delivering electrical current to the LEDs is wound into spirals. The spiraling process can be carried out by a conventional spiraling machine, where the conductive base is placed on a rotating table and a core 9000 passes through a hole in the center of the table. The pitch of the LED is determined by the ratio of the rotation speed and linear speed of the spiraled assembly. The core 9000 may be in any three-dimensional shape, such as a cylinder, a rectangular prism, a cube, a cone, a triangular prism, and may be made of, but not limited to, polymeric materials such as polyvinyl chloride (PVC), polystyrene, ethylene vinyl acetate (EVA), polymethylmethacrylate (PMMA) or the like, or, in one embodiment, elastomer materials such as silicon rubber. The core 9000 may also be solid. In one embodiment, the conductive base delivering electrical current to the LEDs is wound into spirals on a solid plastic core and then encapsulated in a transparent elastomer encapsulant.

Encapsulant

The encapsulant provides protection against environmental elements, such as water and dust, and damage due to loads placed on the integral LED light wire. The encapsulant may be flexible or rigid, and transparent, semi-transparent, opaque, and/or colored. The encapsulant may be made of, but not limited to, polymeric materials such as polyvinyl chloride (PVC), polystyrene, ethylene vinyl acetate (EVA), polymethylmethacrylate (PMMA) or other similar materials or, in one embodiment, elastomer materials such as silicon rubber.

Fabrication techniques concerning the encapsulant include, without limitation, extrusion, casting, molding, laminating, injection molding, or a combination thereof.

In addition to its protective properties, the encapsulant can assist in the scattering and guiding of light in the LED light wire. As illustrated in FIG. 14, that part of the light from the LEDs 202 which satisfies the total internal reflection condition will be reflected on the surface of the encapsulant 1403 and transmitted longitudinally along the encapsulant 1403. Light scattering particles 1404 may be included in the encapsulant 1403 to redirect such parts of the light as shown by light path 1406, as well as attenuate or eliminate hot spots of light. The light scattering particles 1404 are of a size chosen for the wavelength of the light emitted from the LEDs. In a typical application, the light scattering particles 1404 have a diameter in the scale of nanometers and they can be added to the polymer either before or during the extrusion process. Further, as shown in FIG. 14A, conductive base 1401 can also act as or include a light reflector within the LED light wire.

The light scattering particles 1404 may also be a chemical by-product associated with the preparation of the encapsulant 1403. Any material that has a particle size (e.g., a diameter in the scale of nanometers) which permits light to scatter in a forward direction can be a light scattering particle.

The concentration of the light scattering particles 1404 is varied by adding or removing the particles. For example, the light scattering particles 1404 may be in the form of a dopant added to the starting material(s) before or during the extrusion process. Also, air bubbles or any other internal voids may be used as a light scattering particle 1404. The concentration of the light scattering material 1404 within the encapsulant 1403 is influenced by the distance between LEDs, the brightness of the LEDs, and the uniformity of the light. A higher concentration of light scattering material 1404 may increase the distance between neighboring LEDs 202 within the LED light wire. The brightness of the LED light wire may be increased by employing a high concentration of light scattering material 1404 together within closer spacing of the LEDs 202 and/or using brighter LEDs 202. The smoothness and uniformity of the light within the LED light wire can be improved by increasing the concentration of light scattering material 1404 may increase such smoothness and uniformity.

As shown in FIGS. 3, 5A and 5B, the sub-assemblies 310, 510 and 750 are substantially at the center of the encapsulant. The sub-assemblies 310, 510 and 750 are not limited to this location within the encapsulant. The sub-assemblies 310, 510 and 750 may be located anywhere within the encapsulant. Additionally, the cross-sectional profile of the encapsulant is not restricted to circular or oval shapes, and may be any shape (e.g., square, rectangular, trapezoidal, star). Also, the cross-sectional profile of the encapsulant may be optimized to provide either a narrow or wide viewing angle (see light paths 1450 and 1460 in FIGS. 14B (dome-shaped profile of encapsulant 222) and 14C (flat-top profile of encapsulant 223), respectively) and/or lensing for light emitted by the LEDs 202. For example, another thin layer of encapsulant may be added outside the original encapsulant to further control the uniformity of the emitted light from the present invention.

Surface Texturing and Lensing

The surface of the integral LED light wire can be textured and/or lensed for optical effects. The integral LED light wire may be coated (e.g., with a fluorescent material), or include additional layers to control the optical properties (e.g., the diffusion and consistency of illuminance) of the LED light wire. Additionally, a mask may be applied to the outside of the encapsulant to provide different textures or patterns.

Different design shapes or patterns may also be created at the surface of the encapsulant by means of hot embossing, stamping, printing and/or cutting techniques to provide special functions such as lensing, focusing, and/or scattering effects. As shown in FIGS. 15A-C, the present invention includes formal or organic shapes or patterns (e.g., dome, waves, ridges) which influences light rays 1500 to collimate (FIG. 15A), focus (FIG. 15B), or scatter/diffuse (FIG. 15C). The surface of the encapsulant may be textured or stamped during or following extrusion to create additional lensing. Additionally, the encapsulant 93, 303 and 503 may be made with multiple layers of different refractive index materials in order to control the degree of diffusion.

Applications of Integrally Formed LED Light Wire

The present invention of the integrally formed LED light wire finds many lighting applications. The following are some examples such as LED light wires with 360° Illumination, full color LED light wires, LED light wires with sensor or detectors, and LED light wires with individually controlled LEDs. Also, the LED light wires may aligned side-by-side or stacked in order to create a lighting panel. It should be noted that these are only some of the possible light wire applications.

Figure 16A:
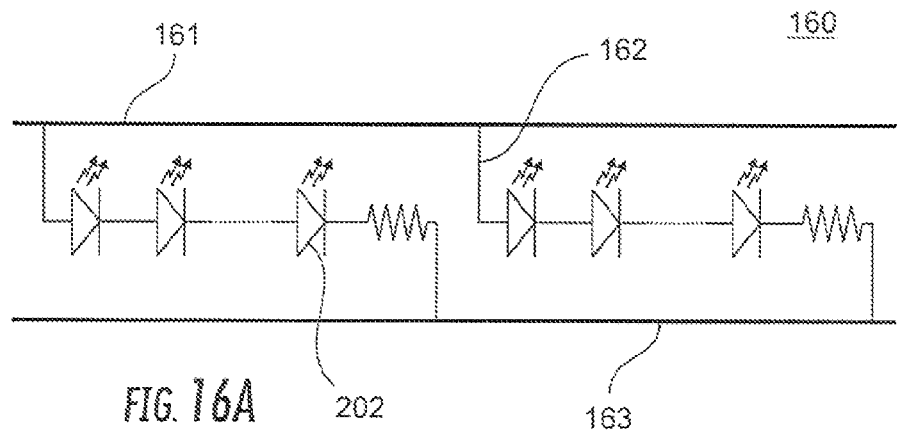
FIG. 16A is a schematic diagram of an integrally formed LED light wire according to an embodiment of the present invention.
Figure 16B:
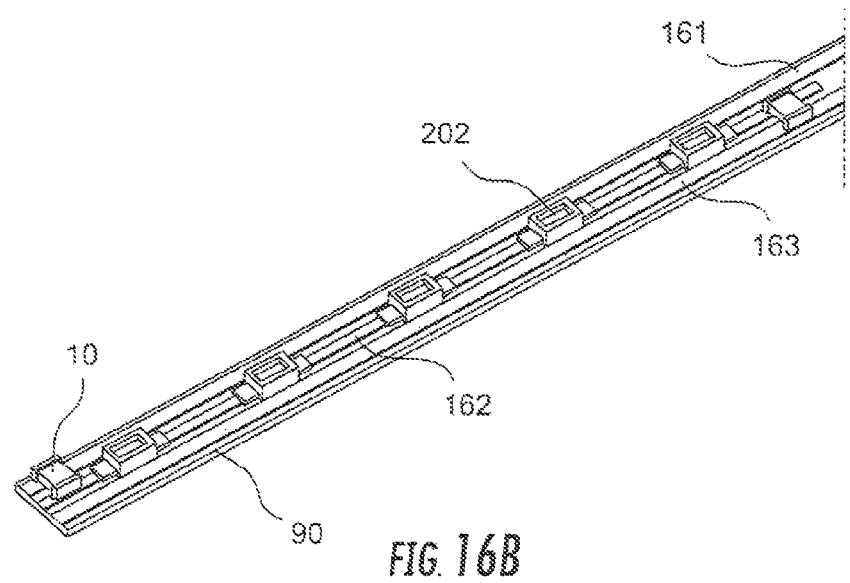
FIG. 16B depicts an embodiment of the integrally formed LED light wire shown in FIG. 16A.

The three copper wires 161, 162, 163 delivering electrical power to the LEDs 202 shown in FIG. 16B forming the conductive base may be wound into spirals (see FIG. 11C). The LEDs are connected to the conductors by soldering, ultrasonic welding or resistance welding. Each neighboring LED can be orientated at the same angle or be orientated at different angles. For example, one LED is facing the front, the next LED is facing the top, the third LED is facing the back, and the fourth one is facing the bottom etc. Thus, the integrally formed LED light wire can illuminate the whole surrounding in 360°.

Figure 16C:
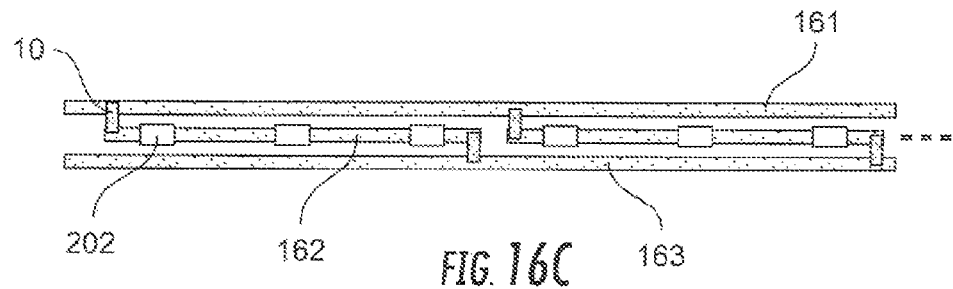
FIG. 16C is a block diagram illustrating the integrally formed LED light wire shown in FIG. 16B.

An embodiment of the integrally formed LED light wire is shown in FIGS. 16B and 16C. As shown, there are two continuous conductors identified as conductive bus elements 161 and 163. Zero ohm jumpers or resistors 10 couple conductor segments 162 to conductive bus elements 161 and 163 to provide power to LED elements 202. As shown in FIG. 16B, conductive bus elements 161 and 163 are mounted on a support substrate 90. In a preferred embodiment, the conductive bus elements 161 and 163 and support substrate 90 are flexible. In another embodiment, the LED light wire with flexible support substrate is wound in spirals about a core 9000 (see, for example, FIG. 11C), and then is encapsulated in an encapsulant.

Figure 20:
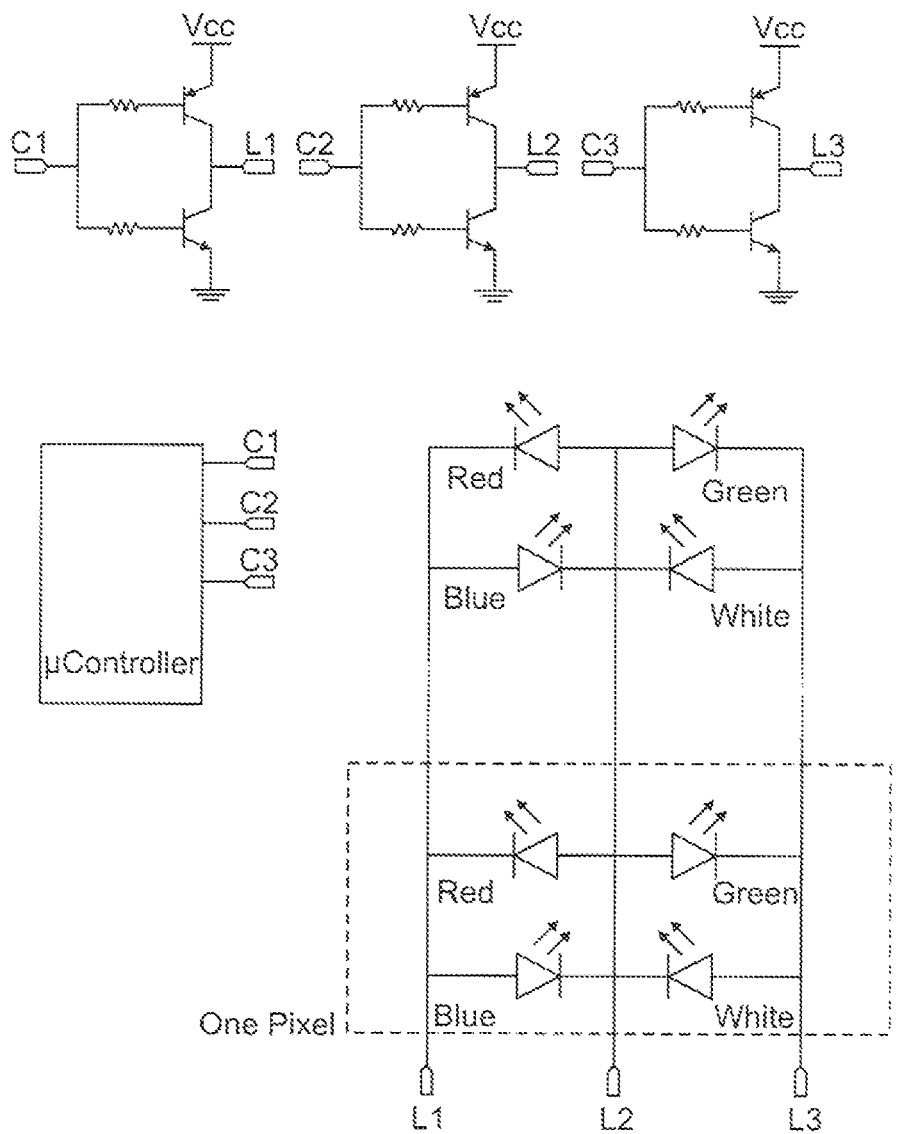
FIG. 20 is a schematic diagram of a control circuit for a full color integrally formed LED light wire.

The integrally formed LED light wire is not limited to single color. For full color application, the single color LED is replaced by multiple LEDs or an LED group consisting of four sub-LEDs in four different colors: red, blue, green, and white as shown in FIG. 20. The intensity of each LED group (one pixel) can be controlled by adjusting the voltage applied across each sub-LED. The intensity of each LED is controlled by a circuit such as the one shown in FIG. 20.

In FIG. 20, L1, L2, and L3 are the three signal wires for supplying electric powers to the four LEDs in each pixel. The color intensity of each sub-LED is controlled by a μController 6000 with the timing chart given in FIG. 21.

Figure 21:
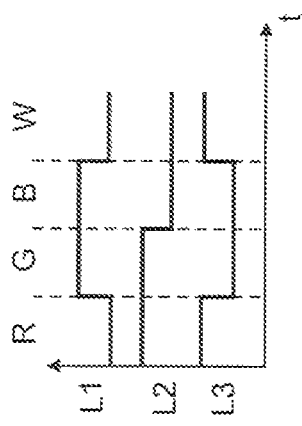
FIG. 21 is a timing diagram for a full color integrally formed LED light wire.

As shown in FIG. 21, because the line voltage L2 is higher than the line voltage L1 over the first segment of time, the red LED (R) is turned on, whereas, during the same time interval, all the other LEDs are reverse biased and hence they are turned off. Similarly, in the second time interval, L2 is higher than L3 thus turning on the green LED (G) and turning off all the other LEDs. The turning on/off of other LEDs in subsequent time segments follows the same reasoning.

Figure 22B:
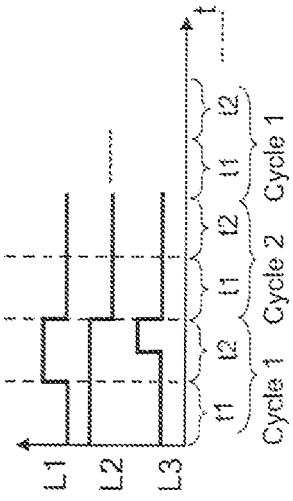
FIG. 22B is a timing diagram for a full color integrally formed LED light wire.
Figure 22A:
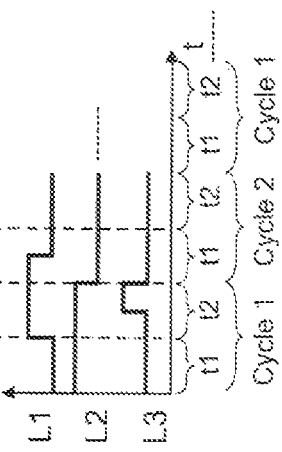
FIG. 22A is a timing diagram for a full color integrally formed LED light wire.
Figure 23:
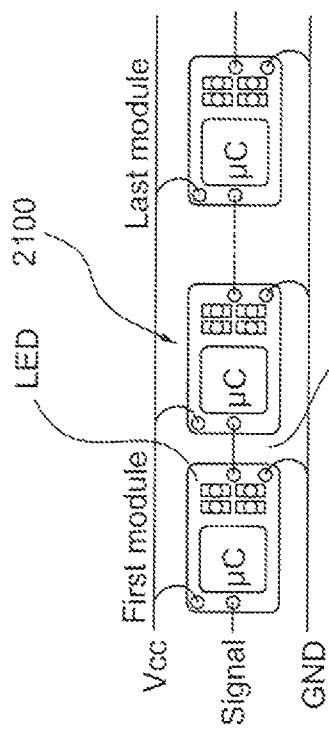
FIG. 23 is a schematic diagram of an integrally formed LED light wire containing a plurality of LED modules according to an embodiment of the present invention.

New colors such as cold white and orange apart from the four basic ones can be obtained by mixing the appropriate basic colors over a fraction of a unit switching time. This can be achieved by programming a microprocessor built into the circuit. FIG. 22A and FIG. 22B show the timing diagrams of color rendering for cold white and orange respectively. It should be noted that the entire color spectrum can be represented by varying the timing of signals L1, L2, and L3.

Figure 27:
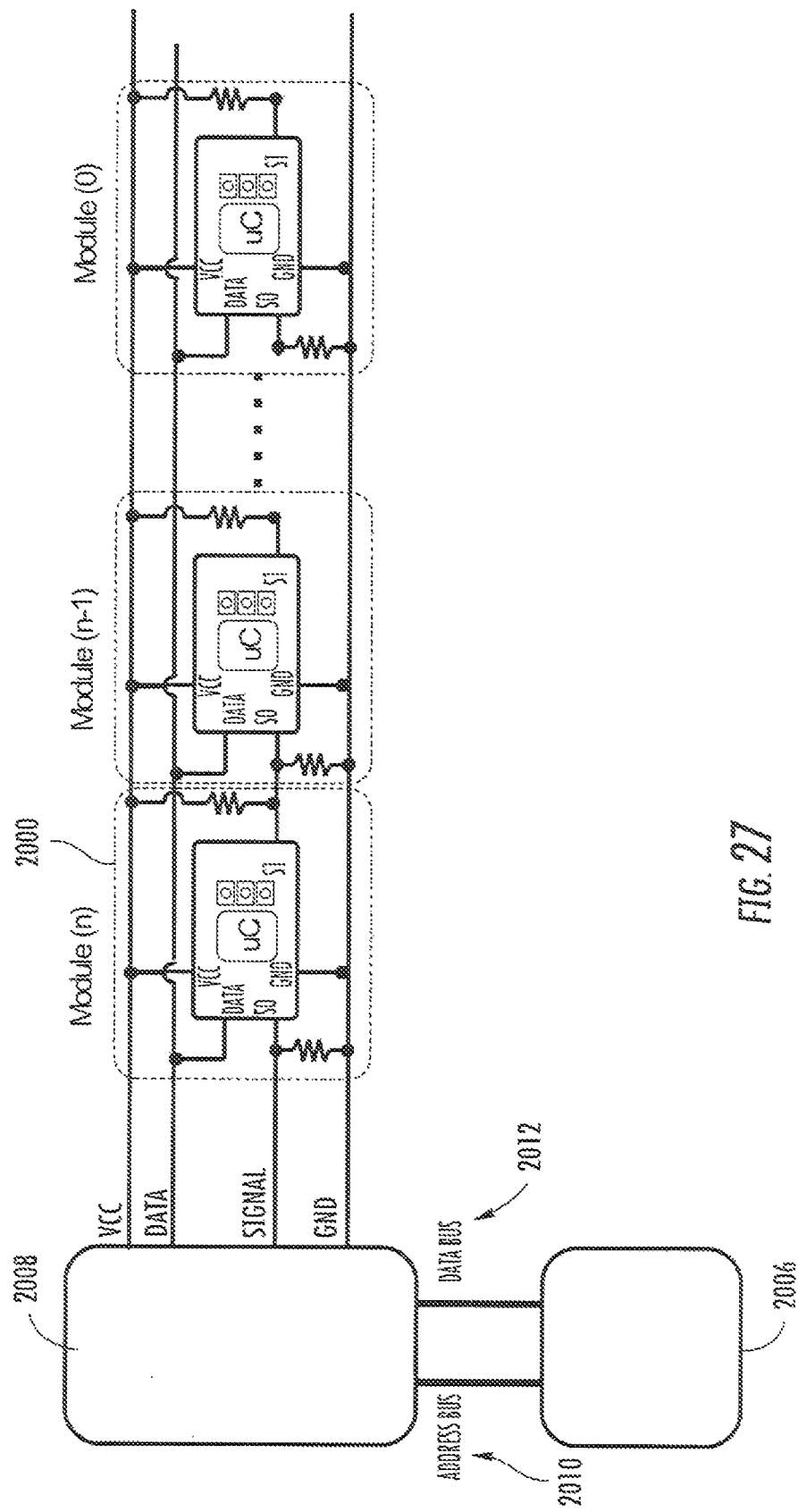
FIG. 27 is a diagram showing plural LED modules as shown in FIG. 26 connected in a light wire configuration.

In one embodiment of the invention, the integrally formed LED light wire includes a plurality of pixels (LED modules), wherein each pixel has one or more LEDs, and each pixel can be controlled independently using a microprocessor circuit integrated with said one or more LEDs. Each pixel is a LED module comprising a microcontroller and at least one or more LEDs (e.g., a single R, G, B, or W LED, three (RGB) LEDs, or four (RGBW) LEDs). FIG. 27 illustrates an exemplary plurality of pixels (LED modules 2100), each pixel with four (RGBW) LEDs. Each LED module 2100 is assigned a unique address. When this address is triggered, that LED module is lit up. The LED modules are serially connected with a signal wire based on a daisy chain or star bus configuration. Alternatively, the LED modules 2100 are arranged in parallel.

There are two ways to assign an address for each LED module in the integrally formed LED light wire. The first approach is static addressing in which each pixel is pre-assigned a fixed address during manufacture, and is unable to monitor any changes, particularly as to pixel failure or a changed length of the LED light wire. The second approach is dynamic addressing in which each pixel is assigned an address dynamically with its own unique address and each pixel being characterized by its own "address" periodically with a trigger signal. Alternatively, the address is assigned dynamically when powered on. Because dynamic addressing allows the LED modules to reconfigure their addressing based on the signals received at an LED module, the integrally LED light wires which use such dynamically addressable LED modules can achieve flexibility as to installation, maintenance, failure detection and repair.

Figure 26:
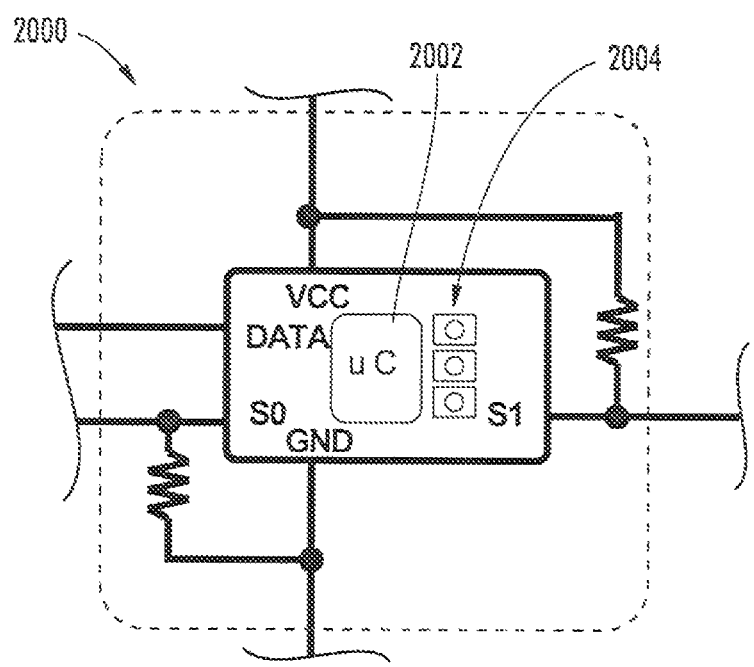
FIG. 26 is a diagram showing an LED module suitable for use in dynamic addressing in the integrally formed LED light wire described in the present application.

In an embodiment, the integrally formed LED light wire includes pixels (LED modules) in which the addresses of the pixels are assigned dynamically, by the pixels themselves, rather than preset during manufacture, as in static addressing. As shown in FIGS. 26 and 27, each LED module 2000 preferably comprises LEDs 2004 (either R, G, B or W LEDs, or a combination thereof); a microcontroller 2002; a data port (DATA); two I/O ports, one of which is configured to be the output port (S0) and one of which is configured to be the input port (S1); one power port (VCC); and one ground port (GND). The diagrammatic layout and wiring of an individual LED module 2000 is shown in FIG. 26.

The function of microcontroller 2002 in each LED module 2000 is to (a) receive data from its own data port and to receive commands and graphic signals, (b) process the dynamic address system, and (c) drive the LED(s) in their own LED module, each LED module forming a pixel.

The LED modules 2000 are preferably connected as follows:
The VCC and GND ports are each connected to the power and ground buses, respectively.
The DATA ports are connected a common bus. Such common bus can transmit control signals to and from LED modules. A control signal can be, for example, a request from a LED module to the remote display memory 2006 for data (e.g., display data (e.g., current display information)), or data from remote display memory 2006 to a specific LED module regarding current display information.
The I/O ports is an out-port and is grounded and the I/O ports S1 is an in-port and is connected to VCC. The in- and out-ports of neighboring LED modules are interconnected as shown in schematic form in FIG. 27. The in-port (S1) of the last LED module in the integrally formed LED light wire only has a connection to its out-port (S0), while its in-port (S1) is left open, designating this particular LED module as the initiating LED module for dynamic addressing when the LED light wire is powered up. In the illustrated embodiment, the last LED module is assigned position No. 0.

That is, the microcontroller of the LED module checks the status of its input port, and if that port is in an unconnected state, recognizes that the pixel to which it belongs should be assigned position 0. The microcontroller of LED module assigned position No. 0 then starts dynamically addressing by communicating its position to its neighboring LED module as No. 0 pixel and assigning thereby its neighbor's address as No. 1. The pixel with an address so assigned then communicates with its succeeding neighboring LED module, in a daisy chain recursion, assigning addresses as shown in FIG. 27. In this manner, the individual pixels, each controlled by a microcontroller, assign their own addresses when powered up and can re-assign the own addresses should the one pixel fail or the LED light wire is cut. It should be noted that the status of the ports recognized by the microcontroller is not limited to being an open state, but may be any predetermined state that could be recognized by the microcontroller as being indicative of no connection.

In a preferred embodiment, all of the LED modules 2000 share a single data line and each LED module sends to the remote display memory 2006 requests for data (e.g., display data (e.g., current display information)), which data is changed and refreshed by the display controller 2008. The display controller 2008 would typically be programmed to update the display data in the display memory 2006, and each pixel (LED module) picks up its respective data from the display memory 2006. A function of the display controller 2008 is to change and refresh the display memory. The display memory 2006 and display controller 2008 would preferably communicate with one another by the use of address bus 2010 and data bus 2012, as is known to those skilled in the art.

The integrally formed LED light wires containing LED modules can be cut to any desired length, even when powered on and functioning. If the integrally formed LED light wire is either cut while powered on, or cut while powered off and afterwards powered on, the cut creates an open circuit and the S1 port of the LED module preceding the cut becomes disconnected. Because the microcontroller of the LED module preceding the cut would now recognize that its S1 port is open, it would then assign itself position No. 0, and by the process described above become the new initiating LED module for dynamic addressing. All preceding LED modules acquire new addresses corresponding to the new initiating LED module.

Figure 17A:
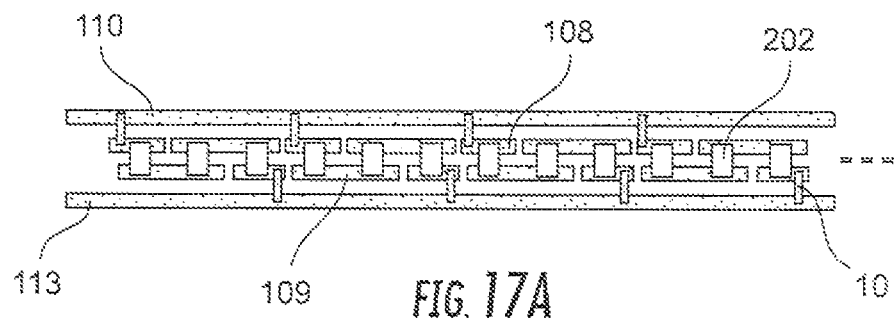
FIG. 17A is a block diagram of an integrally formed LED light wire according to another embodiment of the present invention.
Figure 17B:
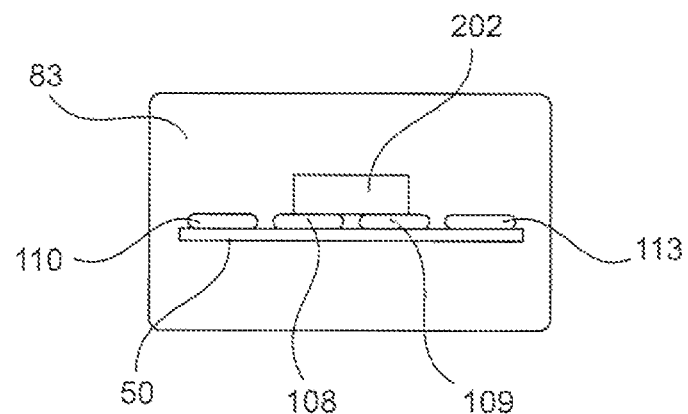
FIG. 17B is a cross-sectional view of the integrally formed LED light wire shown in FIG. 17A.
Figure 17C:
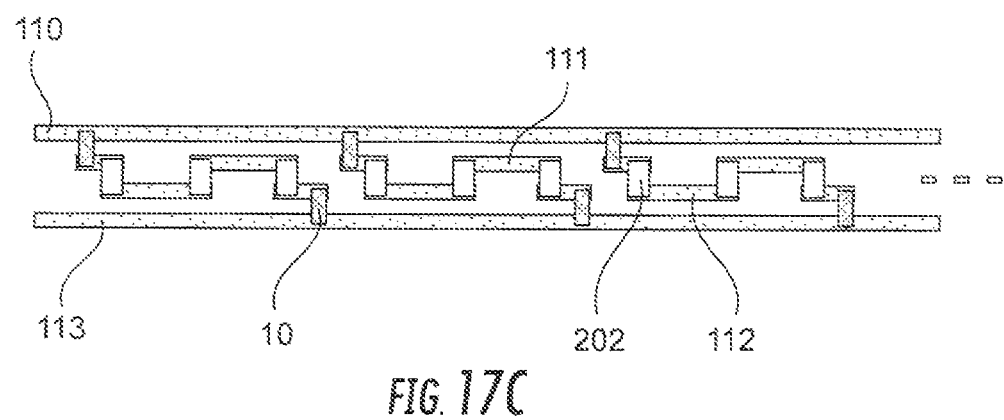
FIG. 17C is a block diagram illustrating an integrally formed LED light wire according to an embodiment of the present invention.

FIGS. 17A-17C depict an embodiment of the LED light wire using a series and parallel connection. This embodiment allows the LEDs to be turned through 90° (positioned transversely instead of longitudinally) and mounted at a much closer pitch.

As shown in FIGS. 18 thru 19B and 24, the integrally formed LED light wire may have a plurality of conductors (e.g., conductive bus elements and conductive segments) which are coupled by zero ohm jumpers or resistors, LEDs, sensors, detectors and/or microprocessors, and are mounted on a support substrate. The functionality of the LED light wire increases with each additional conductor. For example, a sensor or detector which monitors environment conditions (such as humidity, temperature, and brightness) may be integrated in the LED light wire, and connected in such a manner that it may influence the lighting characteristics of the LED light wire. FIG. 18 shows an embodiment of the integrally formed LED light wire with sensors or detectors. As shown, there are four continuous conductors corresponding to conductive bus elements 30, 32, 33 and 34. Zero ohm jumpers or resistors 10 couple conductive segments 31 to conductive bus elements 30 and 32. Conductor bus element 32 acts as a common ground. Conductive bus element 30 provides power to the LEDs 202, while conductive bus element 34 provides power to the sensor/detector 100. Conductive bus element 33 may direct the signal from the sensor/detector 100 to a power source which supplies power to the LEDs 202; thereby, allowing the sensor/detector 100 to influence the lighting characteristics (e.g., intensity, color, pattern, on/off) of the LEDs 202.

Figure 19A:
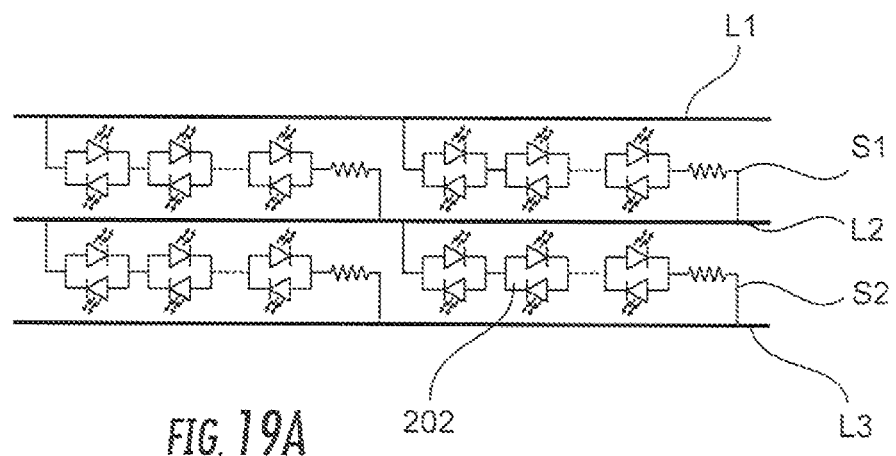
FIG. 19A is a schematic diagram of a full color integrally formed LED light wire according to an embodiment of the present invention.
Figure 19B:
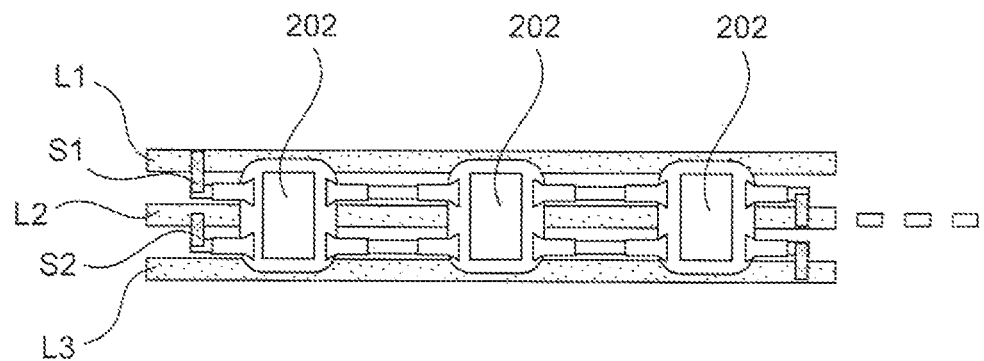
FIG. 19B is a block diagram illustrating an embodiment of the integrally formed LED light wire shown in FIG. 19A.

FIGS. 19A and 19B show a full color integrally formed LED light wire having three continuous conductors corresponding to conductive bus elements L1, L2 and L3 which supply power to the LEDs 202, and conductor segments S1 and S2 connecting the LEDs 202 to conductive bus elements L1, L2 and/or L3. In FIG. 19B, the LEDs 202 are SMD-On-Board LEDs.

Figure 24:
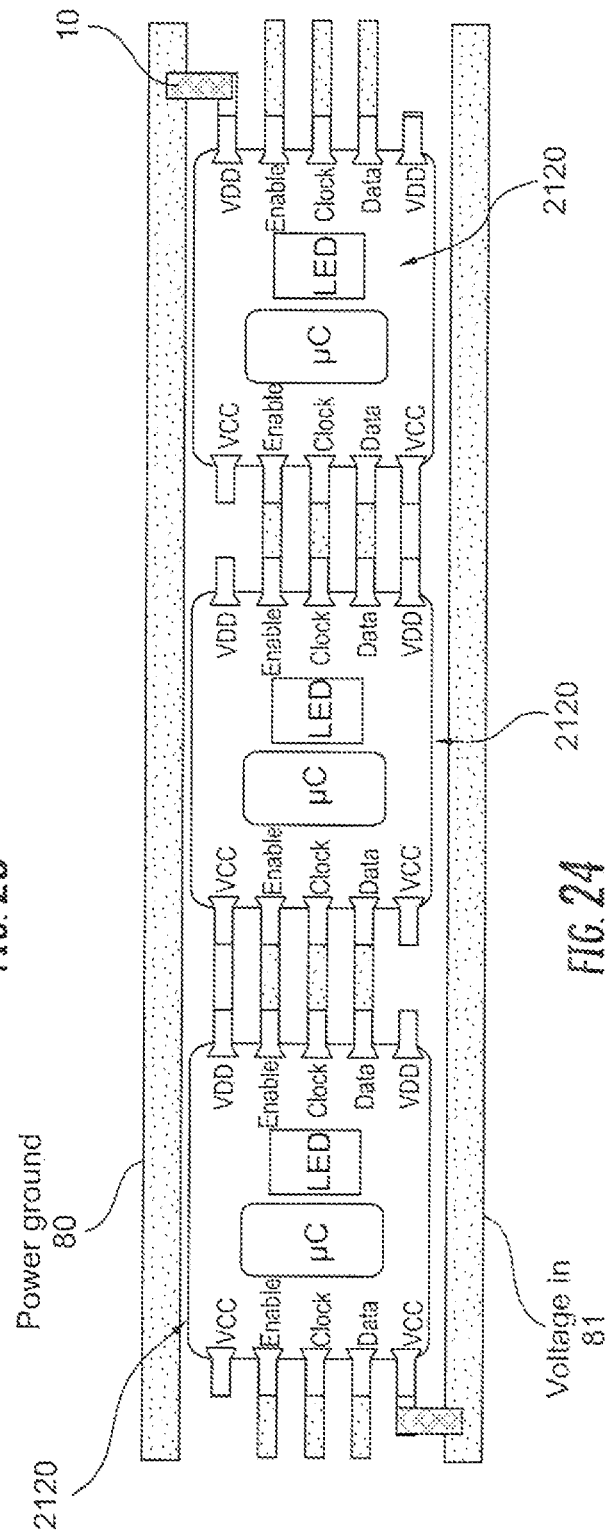
FIG. 24 is a layout diagram of the integrally formed LED light wire shown in FIG. 23.

In another embodiment, each pixel (LED module) may be controlled independently. FIG. 24 shows the configuration of an individually controllable LED light wire using seven conductors and LED modules 2120. Here, conductive bus element 80 acts as a power ground, while conductive bus element 81 acts as a voltage in. Each LED module 2120 includes a microprocessor, at least one LED, power input and output connections, control signal input and output connections, and data input and output connections. In FIG. 24, the LED modules 2120 include VCC pins, VDD pins, enable pins, clock pins and data pins. The control signal and data input connections of each LED module are coupled to the control signal and data input connections of an adjacent LED module. An optocoupler may be used to insulate the control signal line between each LED module. The LED modules 2120 may be connected in series (for example, as shown in FIG. 24) or in parallel (for example, the power input connections of each LED module 2120 is coupled to the first conductive bus element 81 and the power output connection of each LED module 2120 is coupled to the second conductive bus element 80).

Figure 25A:
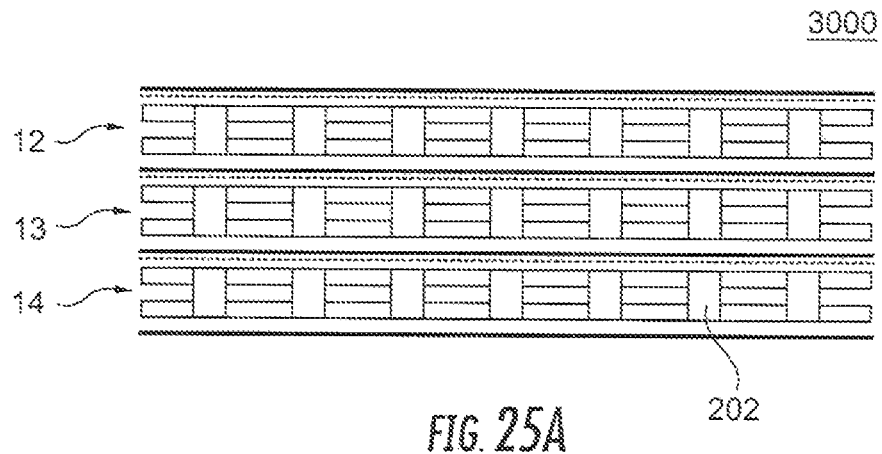
FIG. 25A is a block diagram illustrating a lighting panel comprising a plurality of integrally formed LED light wires with interlocking alignment system according to an embodiment of the present invention.
Figure 25B:
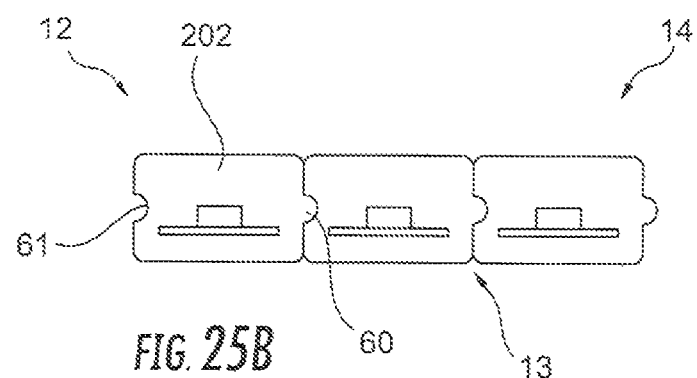
FIG. 25B is a cross-sectional view of the lighting panel shown in FIG. 25A.
Figure 25C:
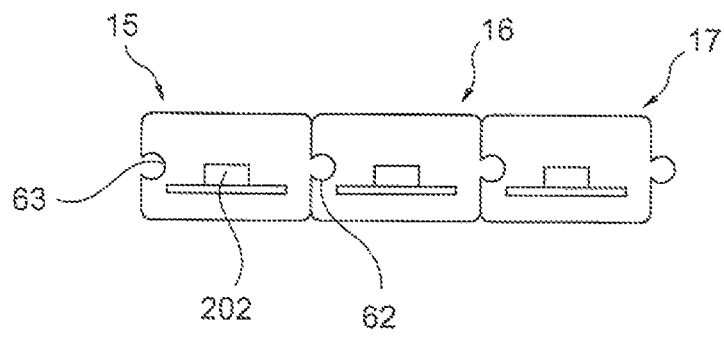
FIG. 25C is a cross-sectional view of a lighting panel comprising a plurality of integrally formed LED light wires according to another embodiment of the present invention

A plurality of integrally formed LED light wires (such as LED light wire 12, 13, 14) may be aligned side-by-side to form a lighting panel 3000 as shown in FIGS. 25A-25C. Each LED light wire may contain an interlocking alignment system comprising an alignment key 60, 62 and an alignment keyhole 61, both of which are pre-formed in the encapsulant of the LED light wire, wherein the alignment key 60, 62 and the alignment keyhole 61 are located at opposite sides of the LED light wire. The alignment key 60, 62 and the alignment keyhole 61, 63 may continuously extend or intermittently extend longitudinally along the length of the LED light wire. The alignment keyhole 61, 63 may be in the form of a notch, a groove, a recess, a slot, or an aperture, and the alignment key 60, 62 may be in a form (including, but without limitation, a rail or a peg) which permits a friction fit (preferably, a snug fit) to the alignment keyhole 61, 63. The alignment key 60, 62 may have a width approximately equal to or slightly larger than the width of the alignment keyhole 61, 63, such that the alignment key 60, 62 may fit therein in a friction fit, as shown in FIGS. 25B and 25C. As an example, the alignment keyhole 61, 63 may be a groove being adapted to friction fit with a rail-shaped alignment key 60, 62, both groove-shaped alignment keyhole 61, 63 and rail-shaped alignment 60 continuously extending longitudinally along the length of the LED light wire.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A freestanding, integrally formed LED light wire, comprising a plurality of LED modules, each LED module comprising:
    one or more LEDs;
    a microcontroller; and
    one or more ports, said microcontroller being configured to:
        check a status of at least one of said one or more ports;
        if the status of the port corresponds to a predetermined state:
            assign the LED module to which said microcontroller belongs to a first display address, and
            send signals to said microcontroller of a neighboring LED module, said signals assigning respective further display address to the neighboring LED module;
    a printed circuit board, wherein the one of more LEDs and the microcontroller are mounted on the printed circuit board; and
    a continuous unitary encapsulant completely and continuously encapsulating said plurality of LED modules, including said respective microcontrollers and said one or more ports.

2. The freestanding, integrally formed LED light wire of claim 1, further comprising a display memory, electrically coupled to said plurality of LED modules, said display memory storing current display information associated with each of said LED modules in said freestanding, integrally formed LED light wire, said current display information stored in said display memory being accessible by each of the microcontrollers of the LED modules, such that said microcontrollers can retrieve current display information.

3. The freestanding, integrally formed LED light wire of claim 2, further comprising:
    a display controller, said display controller being configured to update the current display information stored in said display memory.

4. The freestanding, integrally formed LED light wire of claim 1, wherein said one or more LEDs in each said LED module comprise a red, blue, green or white LED.

5. The freestanding, integrally formed LED light wire of claim 1, wherein said one or more LEDs in each said LED module is either red, blue and green LEDs, or red, blue, green and white LEDs.

6. The freestanding, integrally formed LED light wire of claim 1, wherein said encapsulant further comprising light scattering particles.

7. The freestanding, integrally formed LED light wire of claim 1, wherein said encapsulant further comprising light scattering particles.

8. A freestanding, integrally formed LED light wire, comprising:
    a first bus element formed from a conductive material adapted to distribute power from a power source;
    a second bus element formed from a conductive material adapted to transmit a control signal;
    a third bus element formed from a conductive material adapted as a ground;
    at least two LED modules, each of said LED modules comprising:
        a microcontroller and at least one LED, said LED module being electrically coupled to said first, second and third bus elements;
        one or more ports, said microcontroller being configured to check a status of at least one of said one or more ports, and if the status of the port corresponds to a predetermined state:
            assign said LED module to which said microcontroller belongs to a first display address, and
            send signals to the microcontroller of a neighboring LED module, said signals assigning respective further display address to said neighboring LED module;
    a printed circuit board, wherein the one of more LEDs and the microcontroller are mounted on the printed circuit board; and a continuous unitary encapsulant completely and continuously encapsulating said first, second, and third bus elements, and said at least two LED modules, including said respective microcontrollers and said one or more ports.

9. The freestanding, integrally formed LED light wire of claim 8, further comprising a display memory, electrically coupled to said at least two LED modules, said display memory storing current display information associated with each of the LED modules, said current display information stored in said display memory being accessible by each of the microcontrollers of the LED modules, such that said microcontrollers can retrieve current display information.

10. The freestanding, integrally formed LED light wire of claim 9, further comprising:
   a display controller, said display controller being configured to update the current display information stored in said display memory.

11. The freestanding, integrally formed LED light wire of claim 8, wherein said first, second and third bus elements are made of braided wire.

12. The freestanding, integrally formed LED light wire of claim 8, wherein said at least one LED in each said LED module comprises a red, blue, green or white LED.

13. The freestanding, integrally formed LED light wire of claim 8, wherein said at least one LED in each said LED module is either red, blue and green LEDs, or red, blue, green and white LEDs.

14. The freestanding, integrally formed LED light wire, comprising:
   a support substrate;
   a conductive base mounted on said support substrate, said conductive base comprising a first, second and third conductive bus elements, wherein said first conductive bus element is adapted to distribute power from a power source, said second conductive bus element is adapted to transmit a control signal, and said third conductive bus element is adapted as a ground;
   at least two LED modules, each of said LED modules, comprising:
      a microcontroller and at least one LED, said LED modules being electrically coupled to said first, second and third conductive bus elements;
      one or more ports, said microcontroller being configured to check a status of at least one of the one or more ports, and if the status of the port corresponds to a predetermined state:
         assign the LED module to which said microcontroller belongs to a first display address, and
         send signals to the microcontroller of a neighboring LED module, said signals assigning respective further display address to the neighboring LED module;
      a printed circuit board, wherein the one of more LEDs and the microcontroller are mounted on the printed circuit board; and
   a display memory, electrically coupled to said at least two LED modules, said display memory storing a current display information for each of said LED modules, said current display information stored in said display memory being accessible by each LED module, such that said LED modules can request and retrieve current display information; and
   a continuously unitary encapsulant completely and continuously encapsulating said support substrate, said conductive base, said at least two LED modules, including said respective microcontrollers and said one or more ports, and said display memory.

15. The freestanding, integrally formed LED light wire of claim 14, further comprising:
   a display controller, said display controller being configured to update the current display information stored in said display memory.

16. The freestanding, integrally formed LED light wire of claim 14, wherein said first, second and third conductive bus elements are made of braided wire.

17. The freestanding, integrally formed LED light wire of any one of claims 1, 8 and 14, wherein the outer profile of the encapsulant comprises an alignment key and an alignment keyhole located at opposite sides of the integrally formed LED light wire.

18. A lighting panel comprising a plurality of the freestanding, integrally formed LED light wires of claim 17.

\* \* \* \* \*